(12) United States Patent
Markish et al.

(10) Patent No.: US 11,596,055 B2
(45) Date of Patent: Feb. 28, 2023

(54) APPARATUS AND SYSTEM OF A PRINTED CIRCUIT BOARD (PCB) INCLUDING A RADIO FREQUENCY (RF) TRANSITION

(71) Applicant: INTEL CORPORATION, Santa Clara, CA (US)

(72) Inventors: Ofer Markish, Nesher (IL); Sidharth Dalmia, Portland, OR (US); Arnaud Amadjikpe, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 340 days.

(21) Appl. No.: 16/727,980

(22) Filed: Dec. 27, 2019

(65) Prior Publication Data
US 2020/0137884 A1 Apr. 30, 2020

(51) Int. Cl.
- *H05K 1/02* (2006.01)
- *H05K 1/18* (2006.01)
- *H05K 1/11* (2006.01)
- *G01S 13/931* (2020.01)
- *G01S 7/03* (2006.01)

(52) U.S. Cl.
CPC ............ *H05K 1/0242* (2013.01); *G01S 7/032* (2013.01); *G01S 13/931* (2013.01); *H05K 1/116* (2013.01); *H05K 1/181* (2013.01); *H05K 2201/096* (2013.01); *H05K 2201/09609* (2013.01); *H05K 2201/10734* (2013.01)

(58) Field of Classification Search
CPC ............... H05K 1/0251; H05K 1/0222; H05K 2201/10734; H05K 2201/096; H05K 2201/09536; H05K 2201/09618; H05K 2201/09609; H05K 2201/10098
See application file for complete search history.

(56) References Cited

U.S. PATENT DOCUMENTS

| | | | | |
|---|---|---|---|---|
| 2006/0180905 | A1* | 8/2006 | Zeng | H01L 23/49822 257/E23.079 |
| 2006/0226928 | A1* | 10/2006 | Henning | H05K 1/0222 333/260 |

(Continued)

OTHER PUBLICATIONS

Duixian Liu, Xiaoxiong Gu, Christian W. Baks, and Alberto Valdes-Garcia, "Antenna-in-Package Design Considerations for Ka-Band 5G Communication Applications", IEEE Transactions on Antennas and Propagation, vol. 65, No. 12, Dec. 2017, 8 pages.

*Primary Examiner* — Paresh Paghadal
(74) *Attorney, Agent, or Firm* — Shichrur & Co.

(57) ABSTRACT

For example, an apparatus may include a Printed Circuit Board (PCB) including a Ball Grid Array (BGA) on a first side of the PCB, the BGA configured to connect a Surface Mounted Device (SMD) to the PCB; an antenna disposed on a second side of the PCB opposite to the first side, the antenna to communicate a Radio Frequency (RF) signal of the SMD; and an RF transition to transit the RF signal between the BGA and the antenna, the RF transition including a plurality of signal buried-vias; a first plurality of microvias configured to transit the RF signal between the plurality of signal buried-vias and a ball of the BGA, the first plurality of microvias are rotationally misaligned with respect to the plurality of signal buried-vias; and a second plurality of microvias configured to transit the RF signal between the plurality of signal buried-vias and the antenna.

22 Claims, 10 Drawing Sheets

(56) References Cited

U.S. PATENT DOCUMENTS

| | | | |
|---|---|---|---|
| 2009/0085200 A1* | 4/2009 | Nagaraj | H01L 23/66 257/728 |
| 2012/0018193 A1* | 1/2012 | Hong | H05K 1/116 156/263 |
| 2012/0018194 A1* | 1/2012 | Maeda | H05K 3/0035 174/251 |
| 2018/0366423 A1* | 12/2018 | Ong | H01L 23/49827 |
| 2019/0159333 A1* | 5/2019 | Sinha | H05K 1/0221 |
| 2019/0206780 A1* | 7/2019 | Chatterjee | H01L 23/49827 |
| 2019/0373727 A1* | 12/2019 | Hayashi | H05K 1/0271 |
| 2020/0029431 A1* | 1/2020 | Hayashi | H05K 1/113 |
| 2020/0266519 A1* | 8/2020 | Lee | H04B 7/0617 |
| 2020/0344875 A1* | 10/2020 | Sugahara | H03H 7/38 |
| 2021/0367351 A1* | 11/2021 | Ohkoshi | H05K 1/0222 |

* cited by examiner

APPARATUS AND SYSTEM OF A PRINTED CIRCUIT BOARD (PCB) INCLUDING A RADIO FREQUENCY (RF) TRANSITION

TECHNICAL FIELD

Embodiments described herein generally relate to apparatus and system of a Printed Circuit Board (PCB) including a Radio Frequency (RF) transition.

BACKGROUND

A Printed Circuit Board (PCB) may include a via transition to transit a signal from a first element on a first side of the PCB to a second element on a second side of the PCB.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
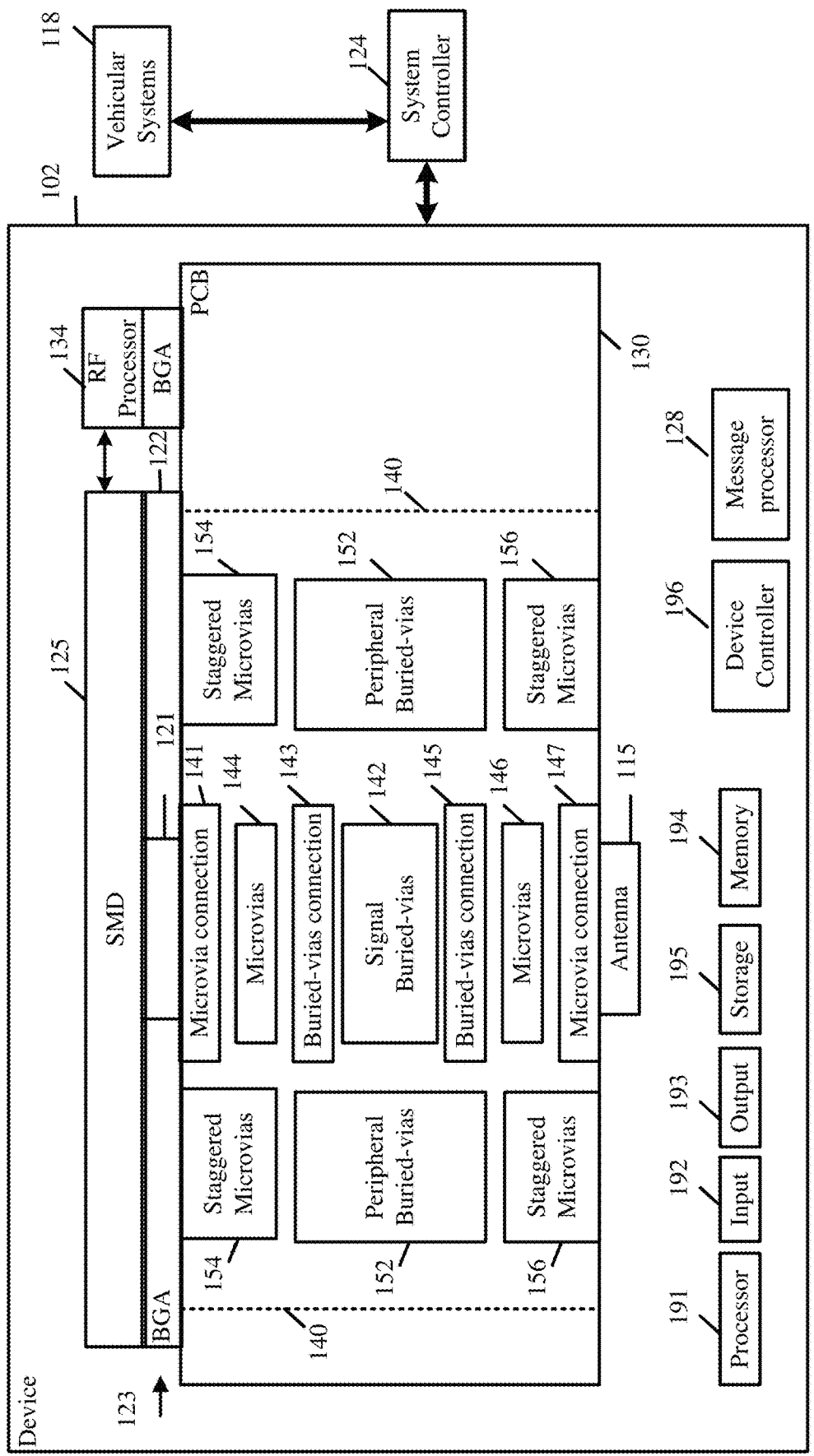
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

References to "one embodiment", "an embodiment", "demonstrative embodiment", "various embodiments" etc., indicate that the embodiment(s) so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

Some embodiments may be used in conjunction with various devices and systems, for example, a radar sensor, a radar device, a radar system, a vehicle, a vehicular system, an autonomous vehicular system, a vehicular communication system, a vehicular device, a sensor device, a User Equipment (UE), a Mobile Device (MD), a wireless station (STA), a Personal Computer (PC), a desktop computer, a mobile computer, a laptop computer, a notebook computer, a tablet computer, a handheld computer, a sensor device, an Internet of Things (IoT) device, a wearable device, a handheld device, a Personal Digital Assistant (PDA) device, a handheld PDA device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some embodiments may be used in conjunction with Radio Frequency (RF) systems, radar systems, vehicular radar systems, detection systems, or the like.

Some embodiments may be used in conjunction with devices and/or networks operating in accordance with existing IEEE 802.11 standards (including IEEE 802.11-2016 (*IEEE 802.11-2016, IEEE Standard for Information technology—Telecommunications and information exchange between systems Local and metropolitan area networks—Specific requirements Part 11: Wireless LAN Medium Access Control (MAC) and Physical Layer (PHY) Specifications, Dec. 7, 2016*), and/or future versions and/or derivatives thereof, devices and/or networks operating in accordance with existing cellular specifications and/or protocols, e.g., 3rd Generation Partnership Project (3GPP), 3GPP Long Term Evolution (LTE) and/or future versions and/or derivatives thereof, units and/or devices which are part of the above networks, and the like.

Some embodiments may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some embodiments may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), FDM Time-Division Multiplexing (TDM), Time-Division Multiple Access (TDMA), Multi-User MIMO (MU-MIMO), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other embodiments may be used in various other devices, systems and/or networks.

The term "wireless device", as used herein, includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device.

Some demonstrative embodiments may be used in conjunction with an RF frequency in a frequency band having a starting frequency above 10 Gigahertz (GHz), for example, a frequency band having a starting frequency between 10 Ghz to 120 GHz. For example, some demonstrative embodiments may be used in conjunction with an RF frequency having a starting frequency above 30 Ghz, for example, above 45 GHz, e.g., above 60 GHz. For example, some demonstrative embodiments may be used in conjunction with an automotive radar frequency band, e.g., a frequency band between 76 GHz and 81 GHz. However, other embodiments may be implemented utilizing any other suitable frequency bands, for example, a wireless communication network communicating over a frequency band of 2.4 GHz, 5 GHz, and/or 6-7 GHz, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

As used herein, the term "circuitry" may refer to, be part of, or include, an Application Specific Integrated Circuit (ASIC), an integrated circuit, an electronic circuit, a processor (shared, dedicated, or group), and/or memory (shared, dedicated, or group), that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g., radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and/or the like. Logic may be executed by one or more processors using memory, e.g., registers, buffers, stacks, and the like, coupled to the one or more processors, e.g., as necessary to execute the logic.

The term "antenna", as used herein, may include any suitable configuration, structure and/or arrangement of one or more antenna elements, components, units, assemblies and/or arrays. In some embodiments, the antenna may implement transmit and receive functionalities using separate transmit and receive antenna elements. In some embodiments, the antenna may implement transmit and receive functionalities using common and/or integrated transmit/receive elements. The antenna may include, for example, a phased array antenna, a single element antenna, a set of switched beam antennas, and/or the like.

Some demonstrative embodiments are described herein with respect to RF radar signals. However, other embodiments may be implemented with respect to any other wireless signals, wireless communication signals, communication scheme, network, standard and/or protocol.

Reference is now made to FIG. 1, which schematically illustrates a block diagram of a system 100, in accordance with some demonstrative embodiments.

In some demonstrative embodiments, system 100 may include a vehicular system, for example, to be implemented and/or mounted in a vehicle.

In one example, system 100 may include an autonomous vehicle system, an automated driving system, a driver assistance and/or support system, and/or the like.

In some demonstrative embodiments, the vehicle may include a car, a truck, a motorcycle, a bus, or any other vehicle.

In some demonstrative embodiments, system 100 may include a device 102, e.g., as described below.

In some demonstrative embodiments, device 102 may include a radar sensing device, a radar detecting device, a radar sensor, or the like, e.g., as described below.

In some demonstrative embodiments, device 102 may be configured to detect, and/or sense, one or more objects, which are located in a vicinity, e.g., a far vicinity and/or a near vicinity, of the vehicle, and to provide one or more parameters, attributes and/or information with respect to the objects.

In some demonstrative embodiments, the objects may include other vehicles, pedestrians, traffic signs, traffic lights, roads and/or the like.

In some demonstrative embodiments, the one or parameters, attributes and/or information with respect to the object may include a range of the objects from the vehicle, a location of the object with respect to the vehicle, a relative speed of the object, and/or the like.

In some demonstrative embodiments, system 100 may include a wireless communication system.

In some demonstrative embodiments, device 102 may include a wireless communication device configured to communicate with one or more other wireless communication devices in the wireless communication system.

In one example, device 102 may include, for example, a UE, an MD, a STA, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a mobile phone, a cellular telephone, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), or the like.

In other embodiments, system 100 may include any other system, and/or device 102 may include any other type of device.

In some demonstrative embodiments, system 100 may include a system controller 124 configured to control one or more functionalities, components, devices and/or elements of system 100.

In some demonstrative embodiments, system controller 124 may configured to control device 102, and/or to process one or parameters, attributes and/or information from device 102.

In some demonstrative embodiments, system controller 124 may be configured, for example, to control one or more vehicular systems 118 of the vehicle, for example, based on information from device 102 and/or one or more other sensors of the vehicle, e.g., Light Detection and Ranging (LIDAR) sensors, camera sensors, and/or the like.

In one example, system controller 124 may control a steering system, a braking system, and/or any other system of the vehicle, for example, based on the information from device 102, e.g., based on one or more objects detected by device 102.

In other embodiments, system controller 124 may be configured, for example, to control any other functionalities of system 100.

In some demonstrative embodiments, device 102 may include, for example, one or more of a processor 191, an input unit 192, an output unit 193, a memory unit 194, and/or a storage unit 195. Device 102 may optionally include other suitable hardware components and/or software components. In some demonstrative embodiments, some or all of the components of one or more of device 102 may be enclosed in a common housing or packaging, and may be interconnected or operably associated using one or more wired or wireless links. In other embodiments, components of one or more of device 102 may be distributed among multiple or separate devices.

In some demonstrative embodiments, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS), e.g., a vehicular operating system, of device 102 and/or of one or more suitable applications.

In some demonstrative embodiments, input unit 192 may include, for example, a touch-screen, a touch-pad, a track-ball, a stylus, a microphone, or other suitable pointing device or input device. Output unit 193 includes, for example, a monitor, a screen, a touch-screen, a flat panel display, a Light Emitting Diode (LED) display unit, a Liquid Crystal Display (LCD) display unit, one or more audio speakers or earphones, or other suitable output devices.

In some demonstrative embodiments, memory unit 194 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102.

In some demonstrative embodiments, device 102 may include a device controller 196 configured to perform and/or to trigger, cause, instruct and/or control device 102 to perform one or more functionalities, operations and/or procedures, and/or to perform one or more communications, to generate and/or communicate one or more messages and/or transmissions.

In some demonstrative embodiments, device controller 196 may be configured process the one or parameters, attributes and/or information of device 102.

In some demonstrative embodiments, device controller 196 may include, or may be implemented, partially or entirely, by circuitry and/or logic, e.g., one or more processors including circuitry and/or logic, memory circuitry and/or logic. Additionally or alternatively, one or more functionalities of device controller 196 may be implemented by logic, which may be executed by a machine and/or one or more processors, e.g., as described below.

In one example, device controller 196 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In some demonstrative embodiments, device 102 may include a message processor 128 configured to generate, process and/or access one or more messages communicated by device 102.

In one example, message processor 128 may be configured to generate one or more messages to be transmitted by device 102, and/or message processor 128 may be configured to access and/or to process one or more messages received by device 102, e.g., as described below.

In some demonstrative embodiments, message processor 128 may include, or may be implemented, partially or entirely, by circuitry and/or logic, e.g., one or more processors including circuitry and/or logic, memory circuitry and/or logic. Additionally or alternatively, one or more functionalities of message processor 128 may be implemented by logic, which may be executed by a machine and/or one or more processors, e.g., as described below.

In some demonstrative embodiments, at least part of the functionality of message processor 128 may be implemented as part of device controller 196.

In other embodiments, the functionality of message processor 128 may be implemented as part of any other element of device 102.

In some demonstrative embodiments, at least part of the functionality of device controller 196 and/or message processor 128 may be implemented by an integrated circuit, for example, a chip, e.g., a System on Chip (SoC). In one example, the chip or SoC may be configured to perform one or more functionalities of device controller 196, and one or more functionalities of message processor 128. In one example, device controller 196 and message processor 128 may be implemented as part of the chip or SoC.

In other embodiments, device controller 196 and/or message processor 128 may be implemented by one or more additional or alternative elements of device 102.

In some demonstrative embodiments, device 102 may include a Printed Circuit Board (PCB) 130 configured to mechanically support and electrically connect between one or more Surface Mounted Devices (SMDs) and one or more other elements of device 102, e.g., as described below.

In some demonstrative embodiments, the SMDs 125 may include electronic components or electrical components. For example, the SMDs 125 may include, for example, transistors, resistors, capacitors, Integrated Circuits (IC), chips, and/or the like.

In one example, PCB 130 may be configured to mechanically support and electrically connect the SMDs 125, for example, using conductive tracks, signal traces, pads and/or any other elements. In one example, the SMDs 125 may be mounted onto, placed directly onto, or attached to, the PCB, e.g., by soldering, for example, to both electrically connect and mechanically attach the SMDs 125 to the PCB 130.

In one example, a PCB can be a single-sided PCB, e.g., including one copper layer, a double-sided PCB, e.g., including two copper layers on both sides of one substrate layer, or a multi-layer PCB, e.g., including outer and inner layers of copper, alternating with layers of substrate. For example, a Multi-layer PCB may allow an increased component density, for example, since circuit traces on the inner layers may be formed, e.g., instead of using surface space between components.

In some demonstrative embodiments, the PCB 130 may include one or more Ball Grid Arrays (BGAs) 122 configured to connect the SMDs 125 to the PCB 130.

In one example, a BGA may include a chip carrier or a surface-mount packaging configured to connect an SMD to a PCB. For example, a BGA may be configured to mount, e.g., permanently mount, SMDs such as microprocessors and the like. For example, a BGA may provide more interconnection pins compared to a dual in-line or flat package connections.

In some demonstrative embodiments, BGA 122 may be on a first side of PCB 130. For example, BGA 122 may be on an upper side or top of the PCB 130, e.g., as described below.

In some demonstrative embodiments, BGA 122 may be configured to connect SMD 125 to PCB 130. For example, SMD 125 may be mounted onto the upper side of the PCB via the BGA 122, e.g., as described below.

In some demonstrative embodiments, PCB 130 may include an antenna 115 disposed on a second side of PCB 130 opposite to the first side, e.g., as described below.

In some demonstrative embodiments, the antenna 115 may be configured to communicate a Radio Frequency (RF) signal of the SMD 125, e.g., as described below.

In some demonstrative embodiments, SMD 125 may include one or more radios configured to generate and transmit, and/or to receive and process the RF signal to be communicated via antenna 115.

In some demonstrative embodiments, the one or more radios may include circuitry and/or logic to perform radar detection and/or wireless communication.

In one example, the one or more radios may include one or more wireless receivers (Rx) including circuitry and/or logic to receive RF signals, radar signals, and/or wireless communication signals, frames, blocks, transmission streams, packets, messages, data items, and/or data.

In another example, the one or more radios may include one or more wireless transmitters (Tx) including circuitry and/or logic to transmit RF signals, radar signals, wireless communication signals, frames, blocks, transmission streams, packets, messages, data items, and/or data.

In some demonstrative embodiments, the one or more radios may include circuitry; logic; Radio Frequency (RF) elements, circuitry and/or logic; baseband elements, circuitry and/or logic; modulation elements, circuitry and/or logic; demodulation elements, circuitry and/or logic; amplifiers; analog to digital and/or digital to analog converters; filters; and/or the like.

In one example, SMD 125 may include a packaged chip including RF transmitters and receivers, for example, in a radar system or wireless communication system. The packaged chip may be assembled on top of PCB 130, and one or more MIMO antenna arrays may be on the opposite side of the PCB 130, e.g., on the bottom side of the PCB.

In some demonstrative embodiments, antenna 115 may be part of a plurality of RF antennas on the second side of the PCB 130. For example, the plurality of RF antennas may be traced on a lower or bottom side of the PCB 130, e.g., as described below.

In one example, antenna 115 may be part of a plurality of Transmit (Tx) antennas on the second side of the PCB 130, which may be configured to transmit Tx signals, for example, of SMD 125, e.g., as described below.

In one example, antenna 115 may be part of a plurality of Receive (Rx) antennas on the second side of the PCB 130, which may be configured to receive Rx signals, for example, for SMD 125, e.g., as described below.

In one example, antenna 115 may include or may be part of any type of antennas suitable for transmitting and/or receiving radar signals and/or wireless communication signals, blocks, frames, transmission streams, packets, messages and/or data. For example, antenna 115 may be implemented as part of any suitable configuration, structure and/or arrangement of one or more antenna elements, components, units, assemblies and/or arrays. Antenna 115 may be implemented as part of, for example, antennas suitable for directional communication, e.g., using beamforming techniques. For example, antenna 115 may be implemented as part of a phased array antenna, a multiple element antenna, a set of switched beam antennas, and/or the like. In some embodiments, antenna 115 may be implemented to support transmit and receive functionalities using separate transmit and receive antenna elements. In some embodiments, antenna 115 may be implemented to support transmit and receive functionalities using common and/or integrated transmit/receive elements.

In some demonstrative embodiments, device 102 may include an RF processor 134 to process information corresponding to the RF signal, e.g., as described below.

In some demonstrative embodiments, RF processor 134 may be mounted onto PCB 130, and may be connected to SMD 125, for example, via traces, conductive tracks and/or the like.

In some demonstrative embodiments, RF processor 134 may include, or may be implemented, partially or entirely, by circuitry and/or logic, e.g., one or more processors including circuitry and/or logic, memory circuitry and/or logic. Additionally or alternatively, one or more functionalities of RF processor 134 may be implemented by logic, which may be executed by a machine and/or one or more processors, e.g., as described below.

In some demonstrative embodiments, an RF transition 140 may be configured to transit the RF signal between BGA 122, which is on the first side of PCB 130, and the antenna 115, which is on the second side of the PCB 130, e.g., as described below.

In one example, a first RF transition may be configured to transit a Tx signal of SMD 125 from BGA 122 to an antenna of a plurality of Tx antennas, e.g., as described below.

In another example, a second RF transition may be configured to transit an Rx signal for SMD 125 from an antenna of a plurality of Rx antennas to BGA 122, e.g., as described below.

Figure 2:
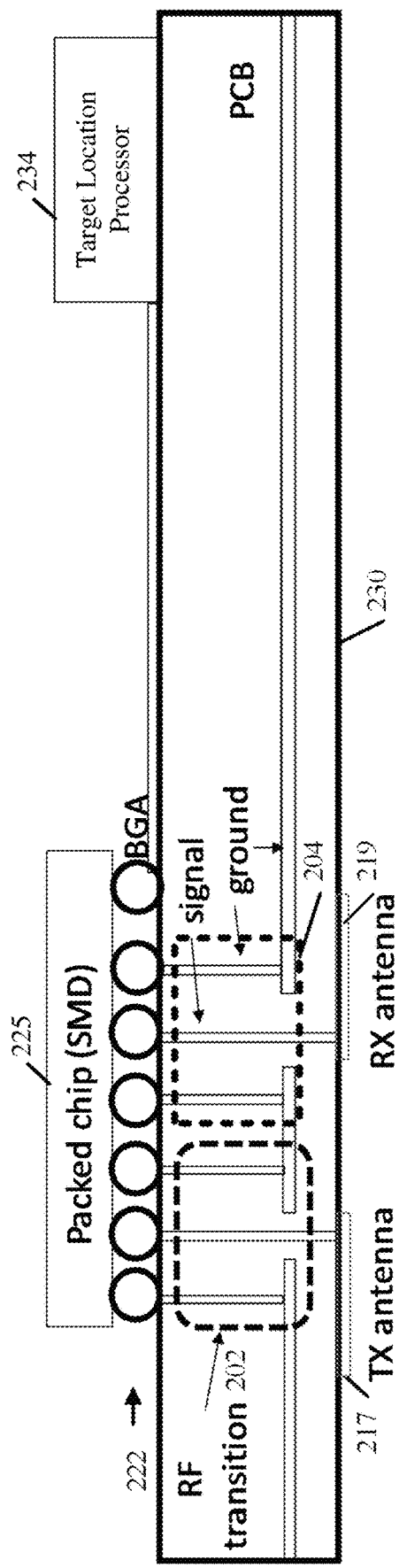
FIG. 2 is a schematic block diagram illustration of a Printed Circuit Board (PCB), in accordance with some demonstrative embodiments.

Reference is made to FIG. 2, which schematically illustrates a PCB 230, in accordance with some demonstrative embodiments.

As shown in FIG. 2, an SMD 225 may be mounted onto a first side of PCB 230 via a BGA 222. For example, SMD 125 (FIG. 1) may include, operate as, perform one or more operations of, and/or perform the functionality of, SMD 225; and/or BGA 122 (FIG. 1) may include, operate as, perform one or more operations of, and/or perform the functionality of, BGA 222.

As shown in FIG. 2, a processor 234 may be mounted onto the first side of PCB 230 and may be connected to SMD 225, for example, to control one or more operations of and/or to process information from SMD 225. For example, RF processor 134 (FIG. 1) may include, operate as, perform one or more operations of, and/or perform the functionality of, processor 234.

In some demonstrative embodiments, as shown in FIG. 2, PCB 230 may include a plurality of RF transitions to transit RF signals from SMD 225 to a plurality of antennas on the second side of the PCB 230, e.g., as described below.

In some demonstrative embodiments, as shown in FIG. 2, a first RF transition 202 may be configured to transit a Tx signal of SMD 225 from BGA 222 to Tx antenna 217.

In some demonstrative embodiments, as shown in FIG. 2, a second RF transition 204 may be configured to transit an Rx signal of SMD 225 from an Rx antenna 219 to BGA 222.

In some demonstrative embodiments, as shown in FIG. 2, an RF transition, e.g., RF transitions 202 and/or 204, may include a signal section to transit the signal, and a ground section to ground a shield around the signal section.

Referring back to FIG. 1, in some demonstrative embodiments, there may be a need to address one or more technical inefficiencies, disadvantages and/or problems in one or more structures, implementation and/or transitions, to transit the RF signal, for example, from one side of PC 130 to the opposite side of PCB 130, for example, between the BGA 122 and the antenna 115, e.g., as described below.

Figure 3:
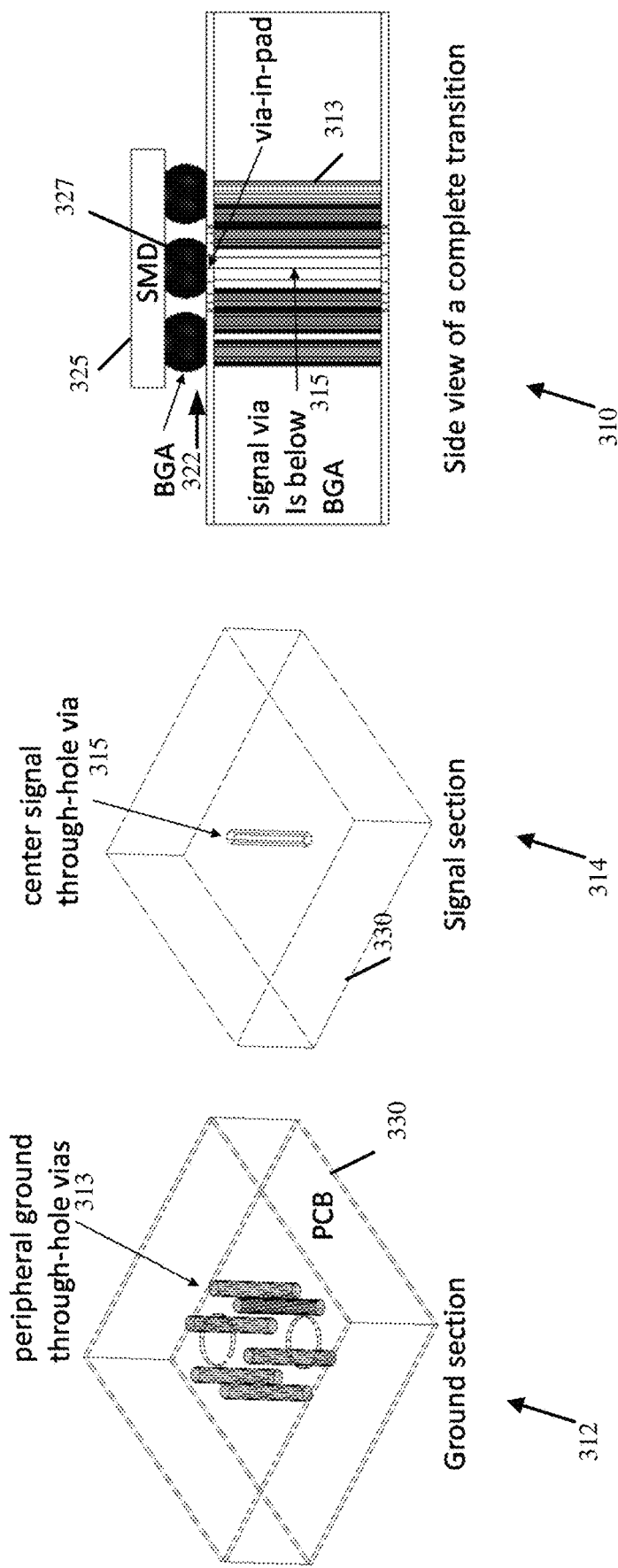
FIG. 3 is a schematic illustration of a via-in-pad transition, to demonstrate one or more technical problems, which may be solved in accordance with some demonstrative embodiments.

Reference is made to FIG. 3, which schematically illustrates a via-in-pad transition 310 in a PCB 330, to demonstrate one or more technical problems, which may be solved in accordance with some demonstrative embodiments.

As shown in FIG. 3, via-in-pad transition 310 may include a ground section 312 including peripheral through-hole vias 313, and a signal section 314 including a central through-hole via 315.

As shown in FIG. 3, the vias 313 and 315 may be used to transit an RF signal of an SMD 325 via a BGA 322 on PCB 330 to an antenna, which is on the bottom side of PCB 330.

As shown in FIG. 3, the vias 313 and 315 may transit the RF signal from a top layer of the PCB 330 to a bottom layer of the PCB 330.

As shown in FIG. 3, central through-hole via 315 may be placed directly below a ball 327 of BGA 322, for example, to shorten a length of the transition and/or to achieve low losses.

As shown in FIG. 3, peripheral through-hole vias 313 may be placed directly below other balls of BGA 322, which are around the ball 327.

In some demonstrative embodiments, the via-in-pad transition 310 may have one or more technical inefficiencies, disadvantages and/or problems in one or more use cases and/or scenarios. For example, placing the ball 327 of BGA 322 directly above central through-hole via 315 may reduce a solder joint strength and/or assembly yield of SMD 325, for example, since a through-hole via, e.g., of central through-hole via 315 and/or peripheral through-hole vias 313, may be large, hollow, and/or may create a non-planar surface at the edges of the through hole.

In one example, central through-hole via 315 and/or peripheral through-hole vias 313 may be filled with dielectric resin and capped with an additional plating layer, for example, to ensure a flat surface at the edges of central through-hole via 315 and/or peripheral through-hole vias 313, and/or to lower a risk for malfunctions during assembly of SMD 325. These additional processes may increase a cost and/or production time of the PCB 330.

Figure 4:
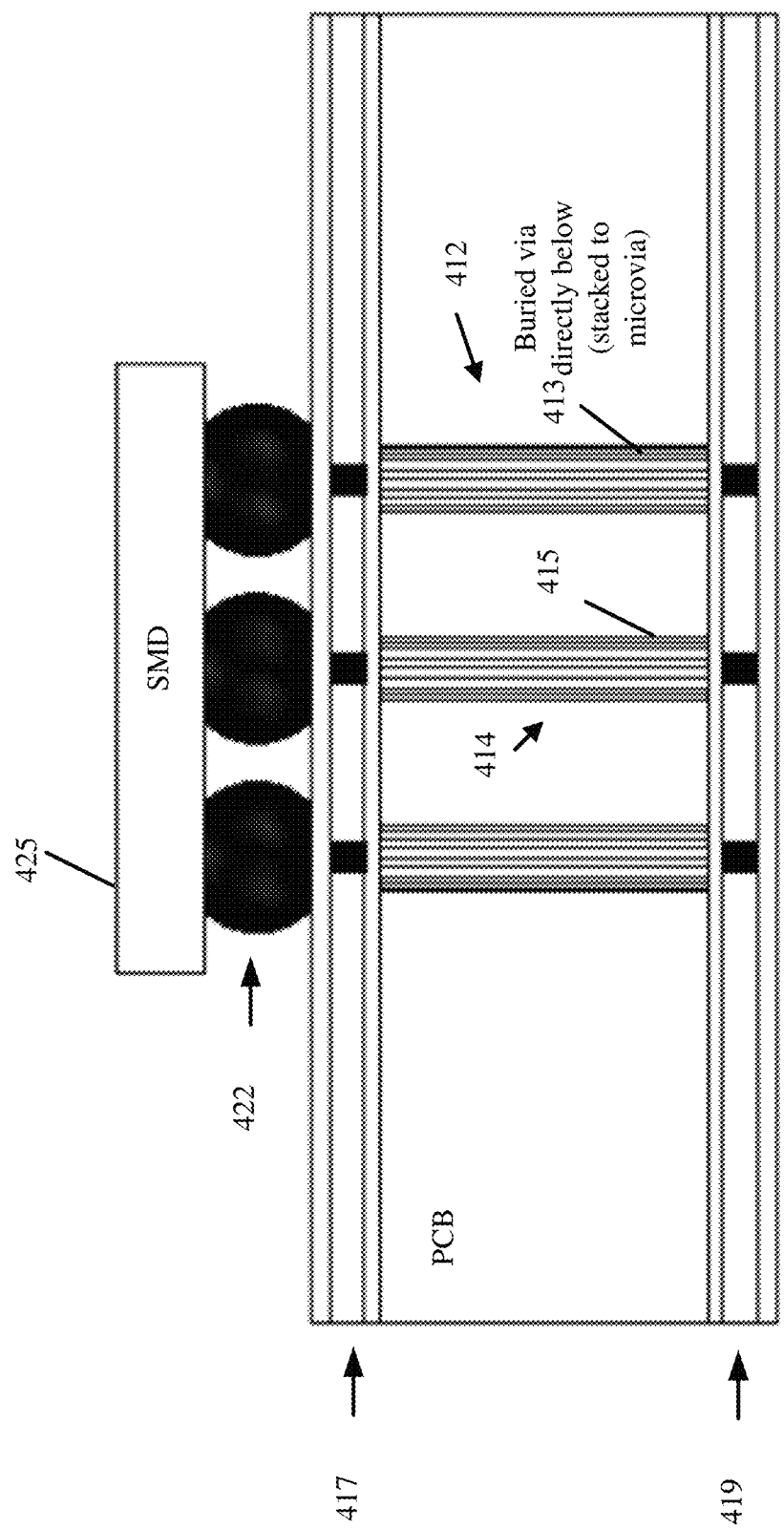
FIG. 4 is a schematic illustration of a stacked-via transition, to demonstrate one or more technical problems, which may be solved in accordance with some demonstrative embodiments.

Reference is made to FIG. 4, which schematically illustrates a stacked-via transition 410 in a PCB 430, to demonstrate one or more technical problems, which may be solved in accordance with some demonstrative embodiments.

As shown in FIG. 4, stacked-via transition 410 may include a ground section 412 including peripheral buried-vias 413, and a signal section 414 including a central buried-via 415.

As shown in FIG. 4, a microvia layer 417 may be in a thin layer below a BGA 422.

As shown in FIG. 4, a microvia layer 419 may be in a thin layer below peripheral buried-vias 413 and central buried-via 415.

As shown in FIG. 4, microvia layers 417 and 419 may transit an RF signal of an SMD 425 via BGA 422 and through PCB layers of PCB 430 using a shortest path, e.g., to attain low losses.

As shown in FIG. 4, microvia layers 417 and 419 may be stacked to buried-vias 413 and 415.

In some demonstrative embodiments, the stacked-via transition 410 may have one or more technical inefficiencies, disadvantages and/or problems in one or more use cases and/or scenarios. For example, the surface at the edges of the buried-via may be non-planar, for example, since a buried-via, e.g., buried-vias 413 and/or 415, may be fabricated in a process that is similar to the through-hole via, e.g., through-hole vias 313 and 315 (FIG. 3). Therefore, stacking a small microvia, e.g., microvia layers 417 and 419, to the buried-via may require capping and resin-filling processes as in the via-in-pad manufacturing, which may increase a cost and/or production time of the PCB 430.

Figure 5:
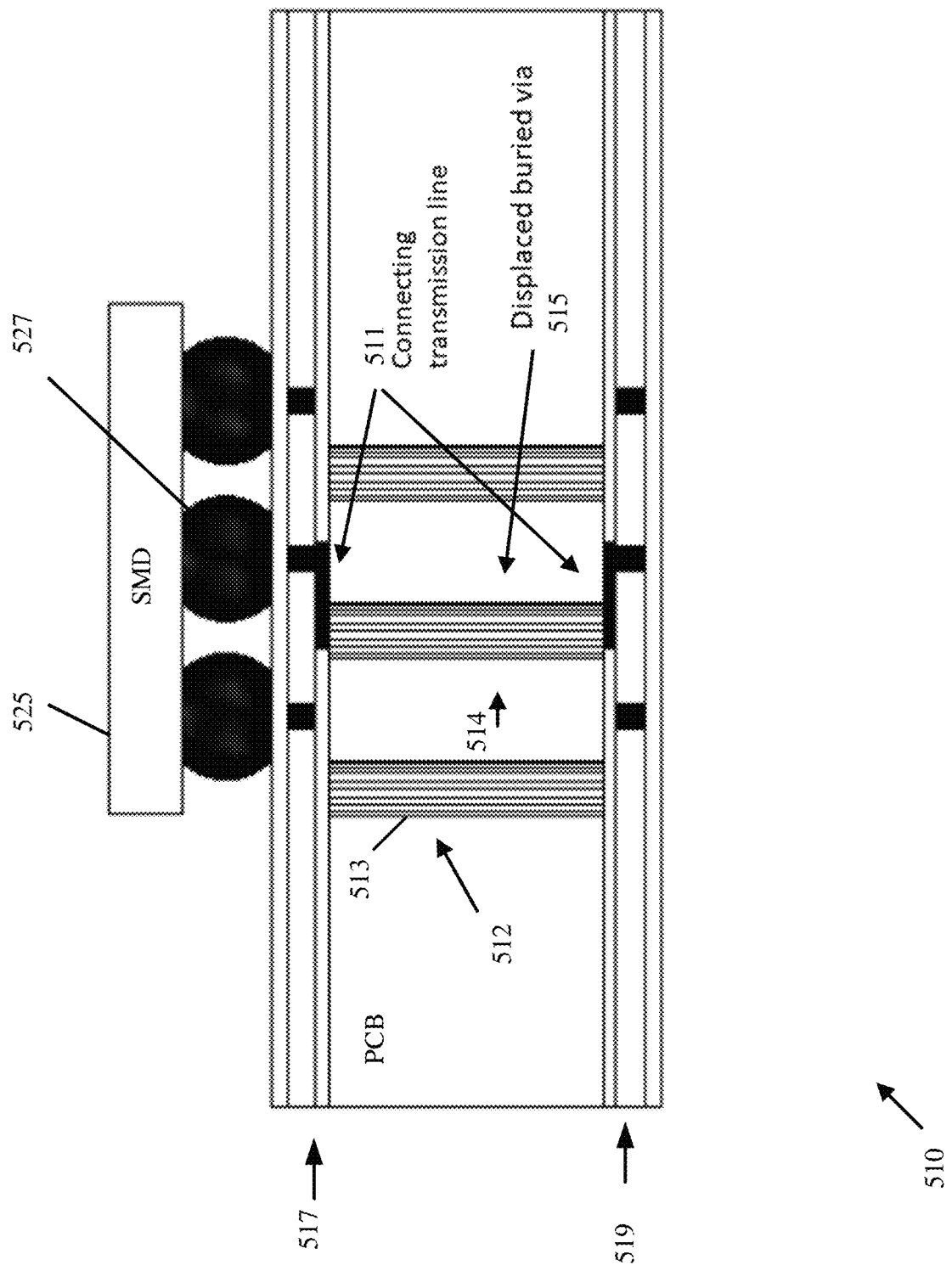
FIG. 5 is a schematic illustration of a displaced-via transition, to demonstrate one or more technical problems, which may be solved in accordance with some demonstrative embodiments.

Reference is made to FIG. 5, which schematically illustrates a displaced-via transition 510 in a PCB 530, to demonstrate one or more technical problems, which may be solved in accordance with some demonstrative embodiments.

As shown in FIG. 5, displaced-via transition 510 may include a ground section 512 including peripheral buried-vias 513, and a signal section 514 including a central buried-via 515.

As shown in FIG. 5, a microvia layer 517 may be in a thin layer below a BGA 522.

As shown in FIG. 5, microvia layer 517 may be displaced with respect to buried-vias 513 and 515, and transmission lines 511, e.g., microstrips, may be used to connect between parts of displaced-via transition 510, for example, to avoid the disadvantages of the via-in-pad and/or the stacked-via, e.g., transitions 310 (FIG. 3) and 410 (FIG. 4).

As shown in FIG. 5, a microvia layer 519 may be in a thin layer below peripheral buried-vias 513 and central buried-via 515.

As shown in FIG. 5, a microvia layer 519 may be displaced with respect to buried-vias 513 and 515, and transmission lines 511 may be used to connect between parts of displaced-via transition 510, for example, to avoid the disadvantages of the via-in-pad transition and/or the stacked-via transition.

In some demonstrative embodiments, the displaced-via transition 510 may have one or more technical inefficiencies, disadvantages and/or problems in one or more use cases and/or scenarios. For example, using the transmission lines 511, e.g., in order to connect between the parts of the transition 510, may increase an RF loss of the transition and/or a size of the transition, and therefore adding the transmission lines 511 may be inefficient and/or disadvantageous.

Referring back to FIG. 1, in some demonstrative embodiments, it may be advantageous to minimize loss of an RF channel between the antenna 115 and the BGA 122. For example, a link budget may be a major performance factor of some systems, e.g., radar systems, and/or in mmWave MIMO automotive radar systems.

In one example, a one aspect, e.g., that may set radar systems apart from other wireless systems, may be a very large number and density of RF signals to be transited to an antenna array. For example, antenna elements may be placed on one side of PCB 130 and SMD 125 may be mounted on other side of the PCB 130, e.g., via BGA 122, for example, to achieve a required low attenuation.

In some demonstrative embodiments, RF transition 140 may be configured to achieve a low cost transition, for example, while maintaining an efficient and/or an effective signal transition from one side of PCB 130 to the other side, e.g., as described below.

In some demonstrative embodiments, RF transition 140 may be implemented in a PCB, e.g., a multilayer PCB, even without implementation of vias-in-pad and/or stacked-vias, even without applying resin-filling and/or capping processes, and/or even without implementation of lossy transmission lines, e.g., as described below.

In some demonstrative embodiments, RF transition 140 may include triple microvia structures connected to a triple buried-via structure, for example, such that the triple buried-via and triple microvias may be rotated with respect to each other, e.g., as described below.

Some demonstrative embodiments described herein may refer to microvia structures including three microvias and buried-via structure including three buried-vias. However, in other embodiments the microvia structures may include more than three microvias and/or the buried-via structure may include more than three buried-vias, which are rotated with respect to each other.

In some demonstrative embodiments, RF transition 140 may be configured to transit the RF signal between the BGA 122 and the antenna 115, e.g., as described below.

In some demonstrative embodiments, RF transition 140 may include a plurality of signal buried-vias 142, e.g., as described below.

In some demonstrative embodiments, RF transition 140 may include a first plurality of microvias 144 configured to transit the RF signal between the plurality of signal buried-vias 142 and a ball 121 of the BGA 122, e.g., as described below.

In some demonstrative embodiments, the first plurality of microvias 144 may be rotationally misaligned with respect to the plurality of signal buried-vias 142, e.g., as described below.

For example, the phrase "rotationally misaligned" may refer to a misalignment between positions of elements, where a position of a first element is rotated with respect to a position of a second element, e.g., in a polar coordinate system.

In one example, the first element may be at a first angle of the polar coordinate system, and the second element may be rotationally misaligned with the first element, when the second element is at a second angle of the polar coordinate system. The first and second elements may have a same distance coordinate, e.g., if the first and second elements are on a same circle, or the first and second elements may have different distance coordinates.

In another example, a first plurality of elements, e.g., microvias 144, may be at a first plurality of angles of the polar coordinate system, and a second plurality of elements, e.g., signal buried-vias 142, may be rotationally misaligned with the first plurality of elements, when the second plurality of elements are at a second plurality of angles of the polar coordinate system, which are different from the first plurality of angles.

In some demonstrative embodiments, RF transition 140 may include a second plurality of microvias 146 configured to transit the RF signal between the plurality of signal buried-vias 142 and the antenna 115, e.g., as described below.

In some demonstrative embodiments, the second plurality of microvias 146 may be rotationally misaligned with respect to the plurality of signal buried-vias 142, e.g., as described below.

In some demonstrative embodiments, the RF signal may include a radar signal, e.g., as described below.

In some demonstrative embodiments, the RF signal may include a wireless communication signal, e.g., as described below.

In some demonstrative embodiments, the RF signal may include an RF signal in a frequency band above 10 GHz, e.g., as described below.

In some demonstrative embodiments, the RF signal may include an RF signal in a frequency band above 30 GHz, e.g., as described below.

In some demonstrative embodiments, the RF signal may include an RF signal in a frequency band above 60 GHz, e.g., as described below.

In some demonstrative embodiments, the RF signal may include an RF signal in a frequency band having a starting frequency between 10 GHz and 120 GHz, e.g., as described below.

In some demonstrative embodiments, the RF signal may include an RF signal in a frequency band between 76 GHz and 81 GHz, e.g., as described below. For example, the RF signal may include an RF signal of an automotive radar band.

In other embodiments, the RF signal may include any other RF signal.

In some demonstrative embodiments, the plurality of buried-vias 142 may include at least three buried-vias, e.g., as described below.

In other embodiments, the plurality of buried-vias 142 may include any other number of buried-vias, e.g., five or more buried-vias.

In some demonstrative embodiments, the first plurality of microvias 144 may include at least three microvias, e.g., as described below.

In other embodiments, the first plurality of microvias 144 may include any other number of microvias, e.g., five or more microvias.

In some demonstrative embodiments, the second plurality of microvias 146 may include at least three microvias, e.g., as described below.

In other embodiments, the second plurality of microvias 146 may include any other number of microvias, e.g., five or more microvias.

In some demonstrative embodiments, the plurality of signal buried-vias 142 may be arranged in a first ring, the first plurality of microvias 144 may be arranged in a second ring concentric with the first ring, and the second plurality of microvias 146 may be arranged in a third ring concentric with the first ring, e.g., as described below.

In some demonstrative embodiments, the ball 121 of the BGA 122 may be on an axis of the first ring, e.g., as described below.

In some demonstrative embodiments, each microvia of the first plurality of microvias 142 may be rotationally misaligned with each of the plurality of signal buried-vias 144, and/or each microvia of the second plurality of microvias 146 may be rotationally misaligned with each of the plurality of signal buried-vias 142, e.g., as described below.

In some demonstrative embodiments, RF transition 140 may include a first buried-via connection layer 143, and/or a second buried-via connection layer 145, e.g., as described below.

In some demonstrative embodiments, the first buried-via connection layer 143 may be configured to connect the first plurality of microvias 144 to first ends of the plurality of signal buried-vias 142, e.g., as described below.

In some demonstrative embodiments, the second buried-via connection layer 145 may be configured to connect the second plurality of microvias 146 to second ends of the plurality of signal buried-vias 142, e.g., as described below.

In some demonstrative embodiments, a surface of the first buried-via connection layer 143 may be connected to the first plurality of microvias 142 in a planar manner, e.g., as described below.

In some demonstrative embodiments, a surface of the second buried-via connection layer 145 may be connected to the second plurality of microvias 146 in a planar manner, e.g., as described below.

In some demonstrative embodiments, RF transition 140 may include a first microvia connection layer 141, and/or a second microvia connection layer 147, e.g., as described below.

In some demonstrative embodiments, the first microvia connection layer 141 may be configured to connect the first plurality of microvias 144 to the ball 121 of the BGA 122, e.g., as described below.

In some demonstrative embodiments, the second microvia connection layer 147 may be configured to connect the second plurality of microvias 144 to the antenna 115, e.g., as described below.

In some demonstrative embodiments, RF transition 140 may include a plurality of peripheral buried-vias 152, for example, around the plurality of signal buried-vias 142, e.g., as described below.

In some demonstrative embodiments, RF transition 140 may include a first plurality of staggered microvias 154 to connect between the plurality of the peripheral buried-vias 152 and a plurality of balls of the BGA 122, for example, around the ball 121 of the BGA, e.g., as described below.

In some demonstrative embodiments, the first plurality of staggered microvias 154 may be staggered with respect to the plurality of peripheral buried-vias 152, e.g., as described below.

In some demonstrative embodiments, RF transition 140 may include a second plurality of staggered microvias 156 microvias to ground the plurality of the peripheral buried-vias 152, e.g., as described below.

In some demonstrative embodiments, the second plurality of staggered microvias 156 may be staggered with respect to the plurality of peripheral buried-vias 152, e.g., as described below.

In some demonstrative embodiments, RF transition 140 may include a ground section and a signal section, e.g., as described below.

In some demonstrative embodiments, the signal section may be configured to transit the RF signal between SMD 125 and antenna 115 via the ball 121, the first microvia connection layer 141, the first plurality of microvias 144, the first buried-via connection layer 143, the plurality of signal buried-vias 142, the second buried-via connection layer 145, the second plurality of microvias 146, and the second microvia connection layer 147, e.g., as described below.

In some demonstrative embodiments, the ground section may be configured to ground the first plurality of staggered microvias 154, the peripheral buried-vias 152, and the second plurality of staggered microvias 156, which are around and surrounding the signal section, e.g., as described below.

In some demonstrative embodiments, device 102 may include an underfill layer 123 between the SMD 125 and the PCB 130, for example, between balls of BGA 122.

In one example, underfill layer 123 may be implemented to impedance match RF transition 140, for example, to achieve a 25 Ohm broadband match or any other match.

In some demonstrative embodiments, PCB 130 may be configured to support communication of a plurality of RF signals, for example, to be provided to/from SMD 125, e.g., as described below.

In some demonstrative embodiments, PCB 130 may include a plurality of Transmit (Tx) antennas, e.g., on the bottom side of PCB 130.

In some demonstrative embodiments, PCB 130 may include a first plurality of RF transitions, e.g., a first plurality of RF transitions 140, configured to transit a plurality of Tx signals from the BGA 122 to the plurality of Tx antennas.

In some demonstrative embodiments, PCB 130 may include a plurality of Receive (Rx) antennas, e.g., on the bottom side of PCB 130.

In some demonstrative embodiments, PCB 130 may include a second plurality of RF transitions e.g., a second plurality of RF transitions 140, configured to transit a plurality of Rx signals, e.g., to be processed by SMD 125, from the plurality of Rx antennas to the BGA.

In some demonstrative embodiments, RF transition 140 may be implemented to provide one or more technical advantages and/or addressing one or more technical problems, for example, for transiting the RF signals via PCB 130.

In some demonstrative embodiments, RF transition 140 may be implemented, for example, even without via-in-pad, stacked-via sections, and/or even without applying resin-filling and/or capping processes. Accordingly, implementation of RF transition 140 may provide a PCB, which may have an increased quality, e.g., a low Defective Parts Per Million (DPPM), a high assembly yield, a low cost, and/or a fast production time.

In some demonstrative embodiments, RF transition 140 may be implemented to have a short length and/or may create a well-defined waveguiding structure, which may not require lossy transmission lines, and, therefore, RF transition 140 may have low RF losses and/or wideband matching.

In some demonstrative embodiments, RF transition 140 may be implemented to enable delivering low cost, electromagnetically efficient, and/or highly reliable, RF products, for example, to automotive radar systems and/or wireless communication systems.

In some demonstrative embodiments, RF transition 140 may be configured to support a solution to eliminate critical points of failure when transiting the RF signal, for example, by having redundancy of vias, e.g., the plurality of buried-vias 142 in the signal section of RF transition 140.

In some demonstrative embodiments, RF transition 140 may be implemented to include a wide-band and low loss RF transition, which may be designed for any desired frequency range. The RF transition 140 may be easily tuned or scaled, for example, such that operation at any frequency, e.g., even up to few hundreds of GHz, may be attained.

In some demonstrative embodiments, a structure of RF transition 140 may be simple, and may be implemented in various standard PCB technologies, and, therefore, the RF transition 140 can be suitable for implementing in various types of radars and/or wireless communication systems.

Figure 6:
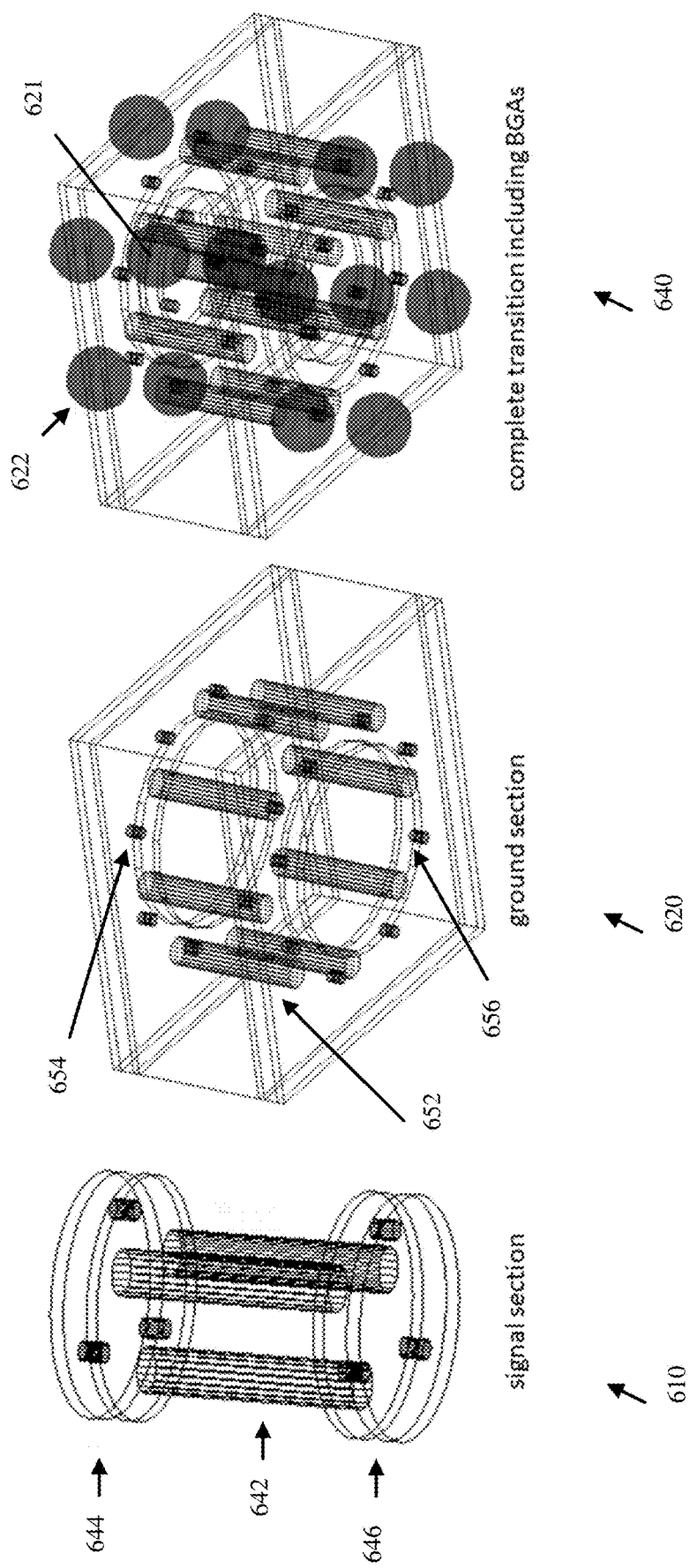
FIG. 6 is a schematic illustration of a Radio Frequency (RF) transition, in accordance with some demonstrative embodiments.

Reference is made to FIG. 6, which schematically illustrates an RF transition 640, in accordance with some demonstrative embodiments. For example, RF transition 140 (FIG. 1) may include and/or may perform the functionality of RF transition 640.

In some demonstrative embodiments, as shown in FIG. 6, RF transition 640 may include a plurality of metal layers and a plurality of vias, which may create a coaxial and symmetric waveguiding structure.

In some demonstrative embodiments, as shown in FIG. 6, an inner part, e.g., a signal section 610, of RF transition 640 may include a triple buried-vias structure 642.

In some demonstrative embodiments, as shown in FIG. 6, signal section 610 may include a first triple microvia structure 644, which may be rotated with respect to triple buried-vias structure 642.

In some demonstrative embodiments, as shown in FIG. 6, signal section 610 may include a second triple microvia structure 646, which may be rotated with respect to triple buried-vias structure 642. In one example, second triple microvia structure 646 may be similar to or identical to the top microvia structure 644.

In some demonstrative embodiments, as shown in FIG. 6, an outer part, e.g., a ground section 620, of RF transition 640, may include peripheral vias 652, for example, around triple buried-vias structure 642.

In some demonstrative embodiments, as shown in FIG. 6, ground section 620 may include first staggered microvias 654, which may be staggered with respect to peripheral vias 652.

In some demonstrative embodiments, as shown in FIG. 6, ground section 620 may include second staggered microvias 656, which may be staggered with respect to peripheral vias 652. In one example, staggered microvias 656 may be similar to or identical to staggered microvias 654.

In some demonstrative embodiments, as shown in FIG. 6, the ground section 620 may include staggered microvias 656 and 654 and buried-vias 652, which may be around the signal section 610.

In some demonstrative embodiments, as shown in FIG. 6, signal section 610 and ground section 620 may create an RF transition, for example, as a complete coaxial structure.

In some demonstrative embodiments, as shown in FIG. 6, an upper part of the signal section 610 may be below a ball 621 of a BGA 622.

In some demonstrative embodiments, placing microvias of the triple micro via structure 644 directly below signal ball 621 may not require resin-filling and capping processes, for example, since the microvias of the triple micro via structure 644 may be small and flat at their edges.

In some demonstrative embodiments, as shown in FIG. 6, a middle part of the signal section 610 may include the triple buried-via structure 642, which may be rotated with respect to the triple microvias structures 644 and/or 646.

In one example, the rotation of triple buried-via structure 642 with respect to the triple microvias structure 644 and/or 646, may support implementing the buried-vias of triple buried-via structure 642 in a manner which is not stacked to the microvias triple microvias structures 644 and/or 646, for example, such that resin-filling and capping of the buried-vias may not be required.

In some demonstrative embodiments, RF transition 640 may be implemented to provide a direct top-to-bottom and well-defined coaxial and symmetric waveguiding structure, for example, since the signal section 610 of the RF transition 640 may be considered as a single continuous inner cylinder of a coaxial cable, and the peripheral vias 652 of the ground section 650 may be considered as an outer part of the coaxial cable. Accordingly, RF transition 640 may have a reduced loss and/or an increased wideband matching, which may be similar to a perfect coaxial cable.

Referring back to FIG. 1, in some demonstrative embodiments, RF transition 140 may be implemented in a multi-layer PCB 130, e.g., as described below.

In some demonstrative embodiments, RF transition 140 may include a first plurality of microvia sections configured to transit the RF signal between the ball 121 of the BGA 122 and the plurality of signal buried-vias 142 via a plurality of first layers of the PCB 130, e.g., as described below.

In some demonstrative embodiments, RF transition 140 may include a second plurality of microvia sections configured to transit the RF signal between the plurality of signal buried-vias 142 and the antenna 115 via a plurality of second layers of the PCB 130, e.g., as described below.

Figure 7:
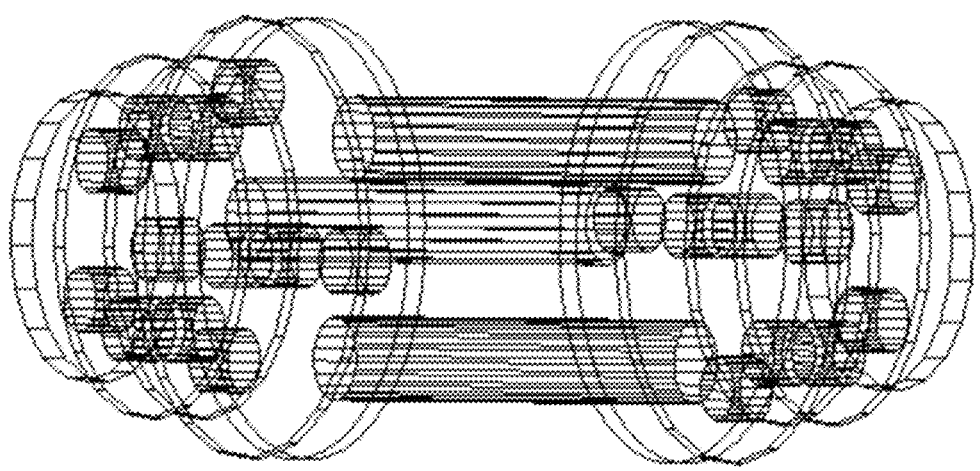
FIG. 7 is a schematic illustration of an RF transition for a multilayer PCB, in accordance with some demonstrative embodiments.
Figure 7:

Reference is made to FIG. 7, which schematically illustrates an RF transition 740 in a multilayer PCB, in accordance with some demonstrative embodiments.

In some demonstrative embodiments, as shown in FIG. 7, RF transition 740 may include a plurality of signal buried-vias 742.

In some demonstrative embodiments, as shown in FIG. 7, RF transition 740 may include a first plurality of microvia sections 744 configured to transit an RF signal between a ball of a BGA, e.g., the ball 121 (FIG. 1), of the BGA 122 (FIG. 1), and the plurality of signal buried-vias 742, for example, via a plurality of first layers of a PCB, e.g., PCB 130 (FIG. 1).

In some demonstrative embodiments, as shown in FIG. 7, RF transition 740 may include a second plurality of microvia sections 746 configured to transit the RF signal between the plurality of signal buried-vias 742 and an antenna, e.g., antenna 115 (FIG. 1), via a plurality of second layers of the PCB, e.g., PCB 130 (FIG. 1).

In some demonstrative embodiments, as shown in FIG. 7, RF transition 740 may include four microvia sections on each side of RF transition 740.

In other embodiments, RF transition 740 may include any other number of microvia sections, e.g., two or more microvia sections.

In some demonstrative embodiments, as shown in FIG. 7, each microvia section of microvia sections 746 and/or 744 may include a triple microvia structure.

In one example, in cases where a multilayer PCB may be implemented, RF transition 740 may be easily extended to a higher number or of layers, for example, by duplicating the triple microvia structure.

In some demonstrative embodiments, stacking microvia sections 746 and/or 744 may not require resin-filling and capping processes, for example, since the microvias may be small and flat at their edges.

In some demonstrative embodiments, implementing a plurality of microvias, e.g., three or more microvias, and a plurality of buried-vias, e.g., three or more buried-vias, may allow creating a continuous signal section in the coaxial structure.

Figure 8:
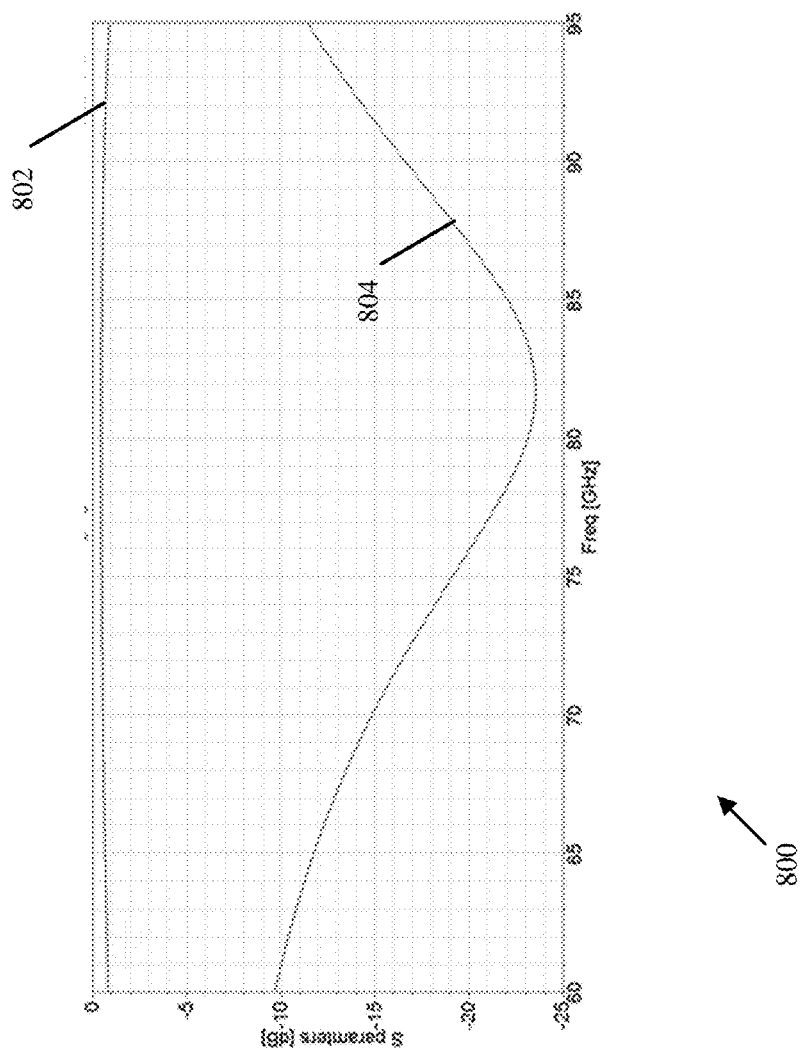
FIG. 8 is a graph depicting a loss of an RF signal versus frequency, in accordance with some demonstrative embodiments.
Figure 8:
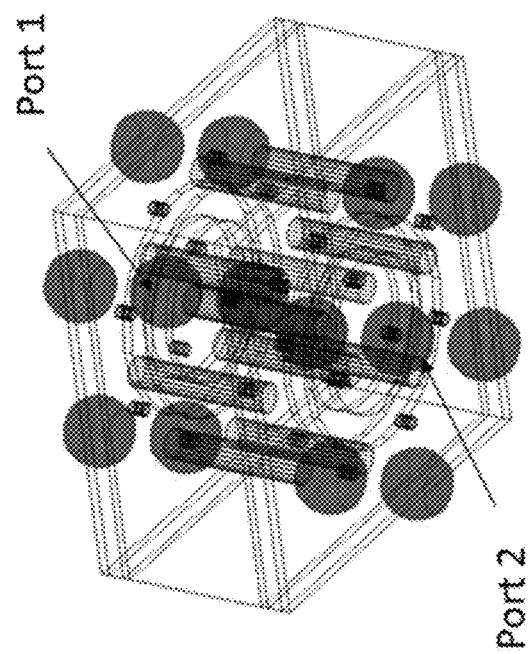

Reference is made to FIG. 8, which schematically illustrates a graph 800 depicting RF loss versus frequency, in accordance with some demonstrative embodiments.

As shown in FIG. 8, a curve 802 may correspond to an RF transition 840, e.g., RF transition 640 (FIG. 6).

As shown in FIG. 8, a curve 804 may correspond to a single displaced-via transition, e.g., displaced-via transition 510 (FIG. 5).

As shown in FIG. 8, RF transition 840 (curve 802) may have increased wideband matching and low losses, e.g., compared to the single displaced-via transition (curve 804).

In some demonstrative embodiments, as shown by curve 802, RF transition 840 may provide excellent performance with reduced losses, e.g., less than 1 dB, and an increased matching, which is better than −10 dB, for example, for an automotive radar frequency range, e.g., a range between 76-81 GHz. As also seen from curve 802 RF transition 840 may provide very good performance in a wide range of other frequencies, e.g., between 60 GHz and 95 GHz.

Figure 9:
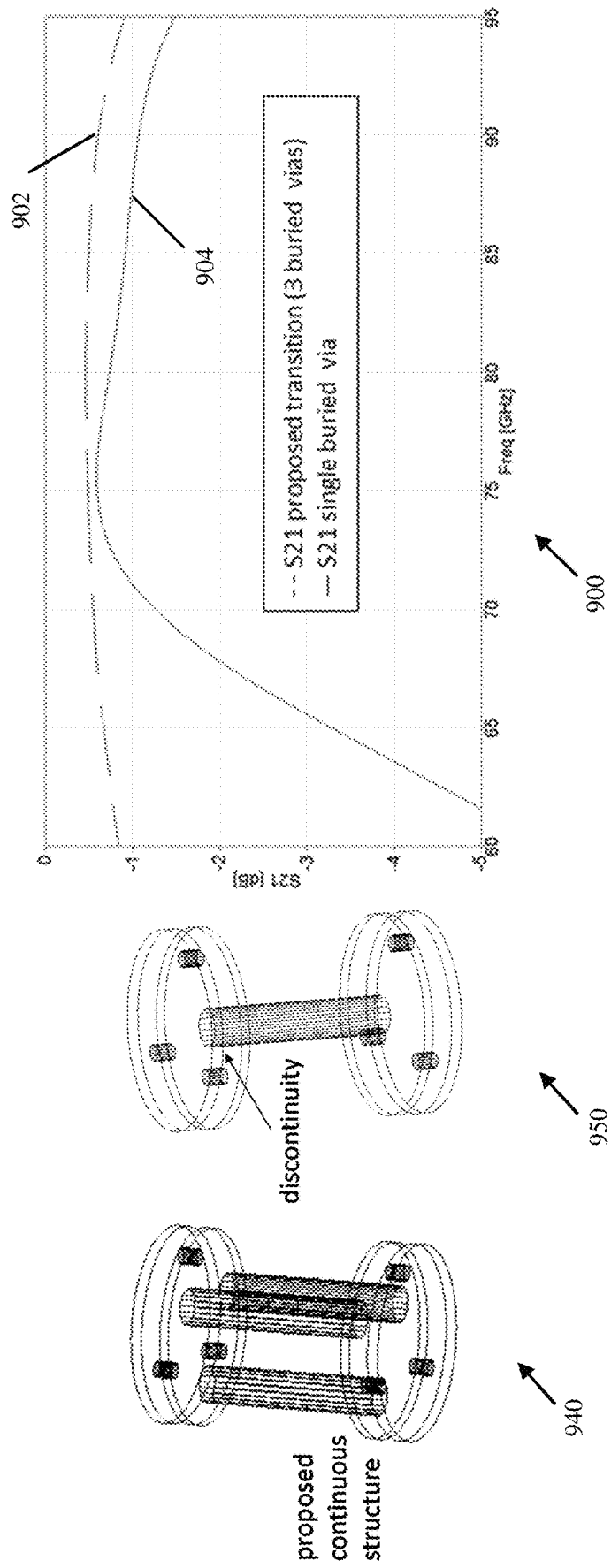
FIG. 9 is a graph depicting losses of an RF signal for two types of RF transitions, in accordance with some demonstrative embodiments.

Reference is made to FIG. 9, which schematically illustrates a graph 900 depicting losses of an RF signal for two types of RF transitions, in accordance with some demonstrative embodiments.

In some demonstrative embodiments, a curve 902 may correspond to an RF transition structure 940, e.g., RF transition 640 (FIG. 6); and a curve 904 may correspond to a single buried-via structure 950 having a single buried-via at the center of the microvias.

In some demonstrative embodiments, as shown in FIG. 9, the RF transition structure 940 may provide reduced losses per curve 902, for example, compared to the losses of single buried-via structure 950 per curve 904.

In one example, single buried-via structure 950 may create discontinuity, which may increase losses and/or narrow a bandwidth of the transition, although single buried-via structure 950 may seem to be a simple alternative, which may meet design rules of RF transition 640 (FIG. 6).

Figure 10:
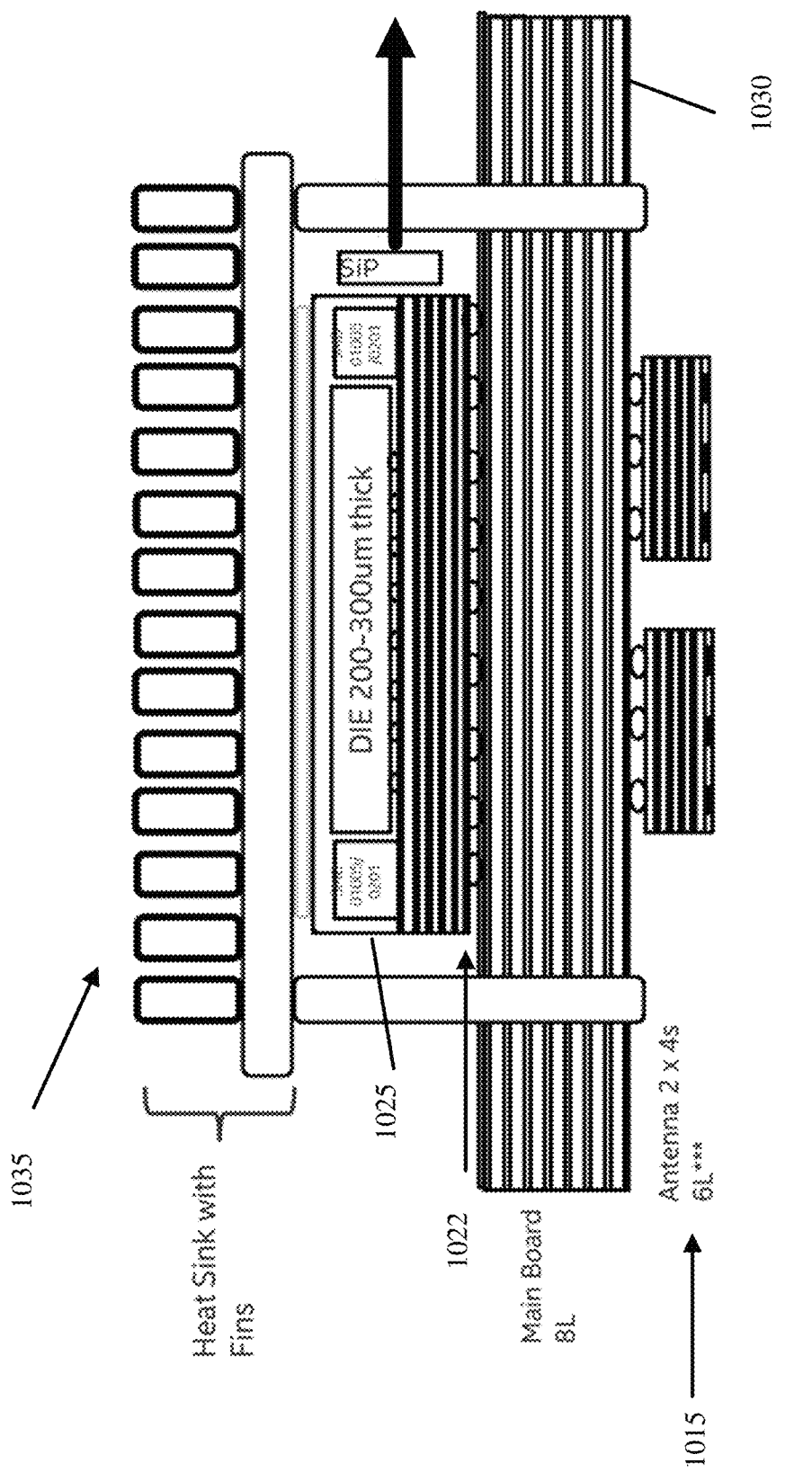
FIG. 10 is a schematic illustration of a multi-partitioned package, in accordance with some demonstrative embodiments.

Reference is made to FIG. 10, which schematically illustrates a multi-partitioned package 1000, in accordance with some demonstrative embodiments.

In some demonstrative embodiments, as shown in FIG. 10, multi-partitioned package 1000 may include a first partition, which may include a die 1025, e.g., a thin die SMD.

In some demonstrative embodiments, as shown in FIG. 10, multi-partitioned package 1000 may include a heat sink layer 1035 on top of die 1025.

In some demonstrative embodiments, as shown in FIG. 10, multi-partitioned package 1000 may include a second partition, which may include a PCB 1030.

In some demonstrative embodiments, for example, the die 125 may be mounted on a first side of PCB 1030, e.g., via a BGA 1022.

In some demonstrative embodiments, as shown in FIG. 10, multi-partitioned package 1000 may include a plurality of RF antennas 1015 on a second side of the PCB 1030.

In some demonstrative embodiments, as shown in FIG. 10, the plurality of RF antennas 1015 may be connected to PCB 1030 via one or more BGAs.

In other embodiments, the plurality of RF antennas 1015 may be traced, printed, and/or patched on the second side of PCB 130.

In some demonstrative embodiments, PCB 1030 may include a plurality of RF transitions, e.g., a plurality of RF transitions 140 (FIG. 1), to transit a plurality of RF signals of SMD 1025 between the first side of PCB 1030 and the second side of PCB 1030, for example, between SMD 1025 and the plurality of antennas 1015.

EXAMPLES

The following examples pertain to further embodiments.

Example 1 includes an apparatus comprising a Printed Circuit Board (PCB), the PCB comprising a Ball Grid Array (BGA) on a first side of the PCB, the BGA configured to connect a Surface Mounted Device (SMD) to the PCB; an antenna disposed on a second side of the PCB opposite to the first side, the antenna to communicate a Radio Frequency (RF) signal of the SMD; and an RF transition to transit the RF signal between the BGA and the antenna, the RF transition comprising a plurality of signal buried-vias; a first plurality of microvias configured to transit the RF signal between the plurality of signal buried-vias and a ball of the BGA, the first plurality of microvias are rotationally misaligned with respect to the plurality of signal buried-vias; and a second plurality of microvias configured to transit the RF signal between the plurality of signal buried-vias and the antenna, the second plurality of microvias are rotationally misaligned with respect to the plurality of signal buried-vias.

Example 2 includes the subject matter of Example 1, and optionally, wherein the RF transition comprises a first buried-via connection layer and a second buried-via connection layer, the first buried-via connection layer to connect the first plurality of microvias to first ends of the plurality of signal buried-vias, the second buried-via connection layer to connect the second plurality of microvias to second ends of the plurality of signal buried-vias.

Example 3 includes the subject matter of Example 2, and optionally, wherein a surface of the first buried-via connection layer is connected to the first plurality of microvias in a planar manner, and wherein a surface of the second buried-via connection layer is connected to the second plurality of microvias in a planar manner.

Example 4 includes the subject matter of any one of Examples 1-3, and optionally, wherein the RF transition comprises a first microvia connection layer and a second microvia connection layer, the first microvia connection layer to connect the first plurality of microvias to the ball of the BGA, and the second microvia connection layer to connect the second plurality of microvias to the antenna.

Example 5 includes the subject matter of any one of Examples 1-4, and optionally, wherein the plurality of signal buried-vias are arranged in a first ring, the first plurality of microvias are arranged in a second ring concentric with the first ring, and the second plurality of microvias are arranged in a third ring concentric with the first ring.

Example 6 includes the subject matter of Example 5, and optionally, wherein the ball of the BGA is disposed on an axis of the first ring.

Example 7 includes the subject matter of any one of Examples 1-6, and optionally, wherein each microvia of the first plurality of microvias is rotationally misaligned with each of the plurality of signal buried-vias, and wherein each microvia of the second plurality of microvias is rotationally misaligned with each of the plurality of signal buried-vias.

Example 8 includes the subject matter of any one of Examples 1-7, and optionally, wherein the RF transition comprises a plurality of peripheral buried-vias around the plurality of signal buried-vias; a first plurality of staggered microvias to connect between the plurality of the peripheral buried-vias and a plurality of balls of the BGA around the ball of the BGA, the first plurality of staggered microvias are staggered with respect to the plurality of peripheral buried-vias; and a second plurality of staggered microvias to ground the plurality of the peripheral buried-vias, the second plurality of staggered microvias are staggered with respect to the plurality of peripheral buried-vias.

Example 9 includes the subject matter of any one of Examples 1-8, and optionally, wherein the RF transition comprises a first plurality of microvia sections configured to transit the RF signal between the ball of the BGA and the plurality of signal buried-vias via a plurality of first layers of the PCB; and a second plurality of microvia sections configured to transit the RF signal between the plurality of signal buried-vias and the antenna via a plurality of second layers of the PCB.

Example 10 includes the subject matter of any one of Examples 1-9, and optionally, wherein the plurality of buried-vias comprises at least three buried-vias, the first plurality of microvias comprises at least three microvias, and the second plurality of microvias comprises at least three microvias.

Example 11 includes the subject matter of any one of Examples 1-10, and optionally, wherein the RF signal comprises an RF signal in a frequency band above 30 Gigahertz (GHz).

Example 12 includes the subject matter of any one of Examples 1-11, and optionally, wherein the RF signal comprises an RF signal in a frequency band between 76 GHz and 81 GHz.

Example 13 includes the subject matter of any one of Examples 1-12, and optionally, wherein the RF signal comprises a radar signal.

Example 14 includes the subject matter of any one of Examples 1-13, and optionally, wherein the RF signal comprises a wireless communication signal.

Example 15 includes the subject matter of any one of Examples 1-14, and optionally, wherein the PCB comprises a plurality of Transmit (Tx) antennas; a first plurality of RF transitions configured to transit a plurality of Tx signals from the BGA to the plurality of Tx antennas; a plurality of Receive (Rx) antennas; and a second plurality of RF transitions configured to transit a plurality of Rx signals from the plurality of Rx antennas to the BGA.

Example 16 includes the subject matter of any one of Examples 1-15, and optionally, comprising the SMD, and a processor configured to process information corresponding to the RF signal.

Example 17 includes the subject matter of Example 16, and optionally, comprising an underfill layer between the SMD and the PCB.

Example 18 includes a radar device comprising a Printed Circuit Board (PCB); a Surface Mounted Device (SMD) to process communication of radar signals; a Ball Grid Array (BGA) on a first side of the PCB, the BGA configured to connect the SMD to the PCB; a plurality of Transmit (Tx) antennas disposed on a second side of the PCB opposite to the first side; a plurality of Receive (Rx) antennas disposed on the second side of the PCB; a first plurality of Radio Frequency (RF) transitions to transit a plurality of Tx signals from the BGA to the plurality of Tx antennas; and a second plurality of RF transitions to transit a plurality of Rx signals from the plurality of Rx antennas to the BGA, wherein an RF transition of the first and second pluralities of RF transitions is configured to transit an RF signal between the BGA and an antenna of the plurality of Tx antennas or the plurality of Rx antennas, the RF transition comprising a plurality of signal buried-vias; a first plurality of microvias configured to transit the RF signal between the plurality of signal buried-vias and a ball of the BGA, the first plurality of microvias are rotationally misaligned with respect to the plurality of signal buried-vias; and a second plurality of microvias configured to transit the RF signal between the plurality of signal buried-vias and the antenna, the second plurality of microvias are rotationally misaligned with respect to the plurality of signal buried-vias.

Example 19 includes the subject matter of Example 18, and optionally, wherein the RF transition comprises a first buried-via connection layer and a second buried-via connection layer, the first buried-via connection layer to connect the first plurality of microvias to first ends of the plurality of signal buried-vias, the second buried-via connection layer to connect the second plurality of microvias to second ends of the plurality of signal buried-vias.

Example 20 includes the subject matter of Example 19, and optionally, wherein a surface of the first buried-via connection layer is connected to the first plurality of microvias in a planar manner, and wherein a surface of the second buried-via connection layer is connected to the second plurality of microvias in a planar manner.

Example 21 includes the subject matter of any one of Examples 18-20, and optionally, wherein the RF transition comprises a first microvia connection layer and a second microvia connection layer, the first microvia connection layer to connect the first plurality of microvias to the ball of the BGA, and the second microvia connection layer to connect the second plurality of microvias to the antenna.

Example 22 includes the subject matter of any one of Examples 18-21, and optionally, wherein the plurality of signal buried-vias are arranged in a first ring, the first plurality of microvias are arranged in a second ring concentric with the first ring, and the second plurality of microvias are arranged in a third ring concentric with the first ring.

Example 23 includes the subject matter of Example 22, and optionally, wherein the ball of the BGA is disposed on an axis of the first ring.

Example 24 includes the subject matter of any one of Examples 18-23, and optionally, wherein each microvia of the first plurality of microvias is rotationally misaligned with each of the plurality of signal buried-vias, and wherein each microvia of the second plurality of microvias is rotationally misaligned with each of the plurality of signal buried-vias.

Example 25 includes the subject matter of any one of Examples 18-24, and optionally, wherein the RF transition comprises a plurality of peripheral buried-vias around the plurality of signal buried-vias; a first plurality of staggered microvias to connect between the plurality of the peripheral buried-vias and a plurality of balls of the BGA around the ball of the BGA, the first plurality of staggered microvias are staggered with respect to the plurality of peripheral buried-vias; and a second plurality of staggered microvias to ground the plurality of the peripheral buried-vias, the second plurality of staggered microvias are staggered with respect to the plurality of peripheral buried-vias.

Example 26 includes the subject matter of any one of Examples 18-25, and optionally, wherein the RF transition comprises a first plurality of microvia sections configured to transit the RF signal between the ball of the BGA and the plurality of signal buried-vias via a plurality of first layers of the PCB; and a second plurality of microvia sections configured to transit the RF signal between the plurality of signal buried-vias and the antenna via a plurality of second layers of the PCB.

Example 27 includes the subject matter of any one of Examples 18-26, and optionally, wherein the plurality of buried-vias comprises at least three buried-vias, the first plurality of microvias comprises at least three microvias, and the second plurality of microvias comprises at least three microvias.

Example 28 includes the subject matter of any one of Examples 18-27, and optionally, wherein the RF signal comprises an RF signal in a frequency band above 30 Gigahertz (GHz).

Example 29 includes the subject matter of any one of Examples 18-28, and optionally, wherein the RF signal comprises an RF signal in a frequency band between 76 GHz and 81 GHz.

Example 30 includes the subject matter of any one of Examples 18-29, and optionally, comprising an underfill layer between the SMD and the PCB.

Example 31 includes the subject matter of any one of Examples 18-30, and optionally, comprising a processor configured to process information corresponding to the radar signals.

Example 32 includes a vehicle comprising a system controller configured to control one or more vehicular systems of the vehicle based on radar information; and a radar device configured to provide the radar information to the system controller, the radar device comprising a radar processor configured to provide the radar information based on radar signals; a Surface Mounted Device (SMD) to process communication of the radar signals; a Printed Circuit Board (PCB); a Ball Grid Array (BGA) on a first side of the PCB, the BGA configured to connect the SMD to the PCB; a plurality of Transmit (Tx) antennas disposed on a second side of the PCB opposite to the first side; a plurality of Receive (Rx) antennas disposed on the second side of the PCB; a first plurality of Radio Frequency (RF) transitions to transit a plurality of Tx signals from the BGA to the plurality of Tx antennas; and a second plurality of RF transitions to transit a plurality of Rx signals from the plurality of Rx antennas to the BGA, wherein an RF transition of the first and second pluralities of RF transitions is configured to transit an RF signal between the BGA and an antenna of the plurality of Tx antennas or the plurality of Rx antennas, the RF transition comprising a plurality of signal buried-vias; a first plurality of microvias configured to transit the RF signal between the plurality of signal buried-vias and a ball of the BGA, the first plurality of microvias are rotationally misaligned with respect to the plurality of signal buried-vias; and a second plurality of microvias configured to transit the RF signal between the plurality of signal buried-vias and the antenna, the second plurality of microvias are rotationally misaligned with respect to the plurality of signal buried-vias.

Example 33 includes the subject matter of Example 32, and optionally, wherein the RF transition comprises a first buried-via connection layer and a second buried-via connection layer, the first buried-via connection layer to connect the first plurality of microvias to first ends of the plurality of signal buried-vias, the second buried-via connection layer to connect the second plurality of microvias to second ends of the plurality of signal buried-vias.

Example 34 includes the subject matter of Example 33, and optionally, wherein a surface of the first buried-via connection layer is connected to the first plurality of microvias in a planar manner, and wherein a surface of the second buried-via connection layer is connected to the second plurality of microvias in a planar manner.

Example 35 includes the subject matter of any one of Examples 32-34, and optionally, wherein the RF transition comprises a first microvia connection layer and a second microvia connection layer, the first microvia connection layer to connect the first plurality of microvias to the ball of the BGA, and the second microvia connection layer to connect the second plurality of microvias to the antenna.

Example 36 includes the subject matter of any one of Examples 32-35, and optionally, wherein the plurality of signal buried-vias are arranged in a first ring, the first plurality of microvias are arranged in a second ring concentric with the first ring, and the second plurality of microvias are arranged in a third ring concentric with the first ring.

Example 37 includes the subject matter of Example 36, and optionally, wherein the ball of the BGA is disposed on an axis of the first ring.

Example 38 includes the subject matter of any one of Examples 32-37, and optionally, wherein each microvia of the first plurality of microvias is rotationally misaligned with each of the plurality of signal buried-vias, and wherein each microvia of the second plurality of microvias is rotationally misaligned with each of the plurality of signal buried-vias.

Example 39 includes the subject matter of any one of Examples 32-38, and optionally, wherein the RF transition comprises a plurality of peripheral buried-vias around the plurality of signal buried-vias; a first plurality of staggered microvias to connect between the plurality of the peripheral buried-vias and a plurality of balls of the BGA around the ball of the BGA, the first plurality of staggered microvias are staggered with respect to the plurality of peripheral buried-vias; and a second plurality of staggered microvias to ground the plurality of the peripheral buried-vias, the second plurality of staggered microvias are staggered with respect to the plurality of peripheral buried-vias.

Example 40 includes the subject matter of any one of Examples 32-39, and optionally, wherein the RF transition comprises a first plurality of microvia sections configured to transit the RF signal between the ball of the BGA and the plurality of signal buried-vias via a plurality of first layers of the PCB; and a second plurality of microvia sections configured to transit the RF signal between the plurality of signal buried-vias and the antenna via a plurality of second layers of the PCB.

Example 41 includes the subject matter of any one of Examples 32-40, and optionally, wherein the plurality of buried-vias comprises at least three buried-vias, the first plurality of microvias comprises at least three microvias, and the second plurality of microvias comprises at least three microvias.

Example 42 includes the subject matter of any one of Examples 32-41, and optionally, wherein the RF signal comprises an RF signal in a frequency band above 30 Gigahertz (GHz).

Example 43 includes the subject matter of any one of Examples 32-42, and optionally, wherein the RF signal comprises an RF signal in a frequency band between 76 GHz and 81 GHz.

Example 44 includes the subject matter of any one of Examples 32-43, and optionally, wherein the radar device comprises an underfill layer between the SMD and the PCB.

Example 45 includes a wireless communication device comprising a Surface Mounted Device (SMD) to process communication of wireless communication signals; a processor configured to process information corresponding to the wireless communication signals; a Printed Circuit Board (PCB); a Ball Grid Array (BGA) on a first side of the PCB, the BGA configured to connect the SMD to the PCB; a plurality of Transmit (Tx) antennas disposed on a second side of the PCB opposite to the first side; a plurality of Receive (Rx) antennas disposed on the second side of the PCB; a first plurality of Radio Frequency (RF) transitions to transit a plurality of Tx signals from the BGA to the plurality of Tx antennas; and a second plurality of RF transitions to transit a plurality of Rx signals from the plurality of Rx antennas to the BGA, wherein an RF transition of the first and second pluralities of RF transitions is configured to transit an RF signal between the BGA and an antenna of the plurality of Tx antennas or the plurality of Rx antennas, the RF transition comprising a plurality of signal buried-vias; a first plurality of microvias configured to transit the RF signal between the plurality of signal buried-vias and a ball of the BGA, the first plurality of microvias are rotationally misaligned with respect to the plurality of signal buried-vias; and a second plurality of microvias configured to transit the RF signal between the plurality of signal buried-vias and the antenna, the second plurality of microvias are rotationally misaligned with respect to the plurality of signal buried-vias.

Example 46 includes the subject matter of Example 45, and optionally, wherein the RF transition comprises a first buried-via connection layer and a second buried-via connection layer, the first buried-via connection layer to connect the first plurality of microvias to first ends of the plurality of signal buried-vias, the second buried-via connection layer to connect the second plurality of microvias to second ends of the plurality of signal buried-vias.

Example 47 includes the subject matter of Example 46, and optionally, wherein a surface of the first buried-via connection layer is connected to the first plurality of microvias in a planar manner, and wherein a surface of the second buried-via connection layer is connected to the second plurality of microvias in a planar manner.

Example 48 includes the subject matter of any one of Examples 45-47, and optionally, wherein the RF transition comprises a first microvia connection layer and a second microvia connection layer, the first microvia connection layer to connect the first plurality of microvias to the ball of the BGA, and the second microvia connection layer to connect the second plurality of microvias to the antenna.

Example 49 includes the subject matter of any one of Examples 45-48, and optionally, wherein the plurality of signal buried-vias are arranged in a first ring, the first plurality of microvias are arranged in a second ring concentric with the first ring, and the second plurality of microvias are arranged in a third ring concentric with the first ring.

Example 50 includes the subject matter of Example 49, and optionally, wherein the ball of the BGA is disposed on an axis of the first ring.

Example 51 includes the subject matter of any one of Examples 45-50, and optionally, wherein each microvia of the first plurality of microvias is rotationally misaligned with each of the plurality of signal buried-vias, and wherein each microvia of the second plurality of microvias is rotationally misaligned with each of the plurality of signal buried-vias.

Example 52 includes the subject matter of any one of Examples 45-51, and optionally, wherein the RF transition comprises a plurality of peripheral buried-vias around the plurality of signal buried-vias; a first plurality of staggered microvias to connect between the plurality of the peripheral buried-vias and a plurality of balls of the BGA around the ball of the BGA, the first plurality of staggered microvias are staggered with respect to the plurality of peripheral buried-vias; and a second plurality of staggered microvias to ground the plurality of the peripheral buried-vias, the second plurality of staggered microvias are staggered with respect to the plurality of peripheral buried-vias.

Example 53 includes the subject matter of any one of Examples 45-52, and optionally, wherein the RF transition comprises a first plurality of microvia sections configured to transit the RF signal between the ball of the BGA and the plurality of signal buried-vias via a plurality of first layers of the PCB; and a second plurality of microvia sections configured to transit the RF signal between the plurality of signal buried-vias and the antenna via a plurality of second layers of the PCB.

Example 54 includes the subject matter of any one of Examples 45-53, and optionally, wherein the plurality of buried-vias comprises at least three buried-vias, the first plurality of microvias comprises at least three microvias, and the second plurality of microvias comprises at least three microvias.

Example 55 includes the subject matter of any one of Examples 45-54, and optionally, wherein the RF signal comprises an RF signal in a frequency band above 30 Gigahertz (GHz).

Example 56 includes the subject matter of any one of Examples 45-55, and optionally, wherein the RF signal comprises an RF signal in a frequency band above 45 GHz.

Example 57 includes the subject matter of any one of Examples 45-56, and optionally, comprising an underfill layer between the SMD and the PCB.

Example 58 comprises an apparatus comprising means for performing any of the described operations of Examples 1-57.

Example 59 comprises a method to perform any of the described operations of Examples 1-57.

Functions, operations, components and/or features described herein with reference to one or more embodiments, may be combined with, or may be utilized in combination with, one or more other functions, operations, components and/or features described herein with reference to one or more other embodiments, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising a Printed Circuit Board (PCB), the PCB comprising:
    a Ball Grid Array (BGA) on a first side of the PCB, the BGA configured to connect a Surface Mounted Device (SMD) to the PCB;
    a plurality of Transmit (Tx) antennas disposed on a second side of the PCB opposite to the first side;
    a plurality of Receive (Rx) antennas disposed on a second side of the PCB;
    a first plurality of Radio Frequency (RF) transitions configured to transit a plurality of Tx signals from the BGA to the plurality of Tx antennas; and
    a second plurality of RF transitions configured to transit a plurality of Rx signals from the plurality of Rx antennas to the BGA,
    wherein an RF transition of the first plurality of RF transitions or the second plurality of RF transitions is configured to transit an RF signal between the BGA and an antenna of the plurality of Tx antennas or the plurality of Rx antennas, the RF transition comprising:
    a plurality of signal buried-vias;
    a first plurality of microvias connected by a first buried-via connection layer to first ends of the plurality of signal buried-vias, the first plurality of microvias connected by a first microvia connection layer to a ball of the BGA, the first plurality of microvias to transit the RF signal between the plurality of signal buried-vias and the ball of the BGA, the first plurality of microvias are rotationally misaligned with respect to the plurality of signal buried-vias; and
    a second plurality of microvias connected by a second buried-via connection layer to second ends of the plurality of signal buried-vias, the second plurality of microvias connected by a second microvia connection layer to the antenna, the second plurality of microvias to transit the RF signal between the plurality of signal buried-vias and the antenna, the second plurality of microvias are rotationally misaligned with respect to the plurality of signal buried-vias.

2. The apparatus of claim 1, wherein a surface of the first buried-via connection layer is connected to the first plurality of microvias in a planar manner, and wherein a surface of the second buried-via connection layer is connected to the second plurality of microvias in a planar manner.

3. The apparatus of claim 1, wherein the plurality of signal buried-vias are arranged in a first ring, the first plurality of microvias are arranged in a second ring concentric with the first ring, and the second plurality of microvias are arranged in a third ring concentric with the first ring.

4. The apparatus of claim 3, wherein the ball of the BGA is disposed on an axis of the first ring.

5. The apparatus of claim 1, wherein each microvia of the first plurality of microvias is rotationally misaligned with each of the plurality of signal buried-vias, and wherein each microvia of the second plurality of microvias is rotationally misaligned with each of the plurality of signal buried-vias.

6. The apparatus of claim 1, wherein the RF transition comprises:
    a plurality of peripheral buried-vias around the plurality of signal buried-vias;
    a first plurality of staggered microvias to connect between the plurality of the peripheral buried-vias and a plurality of balls of the BGA around the ball of the BGA, the first plurality of staggered microvias are staggered with respect to the plurality of peripheral buried-vias; and
    a second plurality of staggered microvias to ground the plurality of the peripheral buried-vias, the second plurality of staggered microvias are staggered with respect to the plurality of peripheral buried-vias.

7. The apparatus of claim 1, wherein the RF transition comprises:
    a first plurality of microvia sections configured to transit the RF signal between the ball of the BGA and the plurality of signal buried-vias via a plurality of first layers of the PCB; and
    a second plurality of microvia sections configured to transit the RF signal between the plurality of signal buried-vias and the antenna via a plurality of second layers of the PCB.

8. The apparatus of claim 1, wherein the plurality of buried-vias comprises at least three buried-vias, the first plurality of microvias comprises at least three microvias, and the second plurality of microvias comprises at least three microvias.

9. The apparatus of claim 1, wherein the RF signal comprises an RF signal in a frequency band above 30 Gigahertz (GHz).

10. The apparatus of claim 1, wherein the RF signal comprises an RF signal in a frequency band between 76 GHz and 81 GHz.

11. The apparatus of claim 1, wherein the RF signal comprises a radar signal.

12. The apparatus of claim 1, wherein the RF signal comprises a wireless communication signal.

13. The apparatus of claim 1 comprising the SMD, and a processor configured to process information corresponding to the RF signal.

14. The apparatus of claim 13 comprising an underfill layer between the SMD and the PCB.

15. A radar device comprising:
a Printed Circuit Board (PCB);
a Surface Mounted Device (SMD) to process communication of radar signals;
a Ball Grid Array (BGA) on a first side of the PCB, the BGA configured to connect the SMD to the PCB;
a plurality of Transmit (Tx) antennas disposed on a second side of the PCB opposite to the first side;
a plurality of Receive (Rx) antennas disposed on the second side of the PCB;
a first plurality of Radio Frequency (RF) transitions to transit a plurality of Tx signals from the BGA to the plurality of Tx antennas; and
a second plurality of RF transitions to transit a plurality of Rx signals from the plurality of Rx antennas to the BGA,
wherein an RF transition of the first plurality of RF transitions or the second plurality of RF transitions is configured to transit an RF signal between the BGA and an antenna of the plurality of Tx antennas or the plurality of Rx antennas, the RF transition comprising:
a plurality of signal buried-vias;
a first plurality of microvias connected by a first buried-via connection layer to first ends of the plurality of signal buried-vias, the first plurality of microvias connected by a first microvia connection layer to a ball of the BGA, the first plurality of microvias to transit the RF signal between the plurality of signal buried-vias and the ball of the BGA, the first plurality of microvias are rotationally misaligned with respect to the plurality of signal buried-vias; and
a second plurality of microvias connected by a second buried-via connection layer to second ends of the plurality of signal buried-vias, the second plurality of microvias connected by a second microvia connection layer to the antenna, the second plurality of microvias to transit the RF signal between the plurality of signal buried-vias and the antenna, the second plurality of microvias are rotationally misaligned with respect to the plurality of signal buried-vias.

16. The radar device of claim 15, wherein a surface of the first buried-via connection layer is connected to the first plurality of microvias in a planar manner, and wherein a surface of the second buried-via connection layer is connected to the second plurality of microvias in a planar manner.

17. The radar device of claim 15, wherein the plurality of buried-vias comprises at least three buried-vias, the first plurality of microvias comprises at least three microvias, and the second plurality of microvias comprises at least three microvias.

18. The radar device of claim 15, wherein the plurality of signal buried-vias are arranged in a first ring, the first plurality of microvias are arranged in a second ring concentric with the first ring, and the second plurality of microvias are arranged in a third ring concentric with the first ring.

19. The radar device of claim 15, wherein the RF transition comprises:
a plurality of peripheral buried-vias around the plurality of signal buried-vias;
a first plurality of staggered microvias to connect between the plurality of the peripheral buried-vias and a plurality of balls of the BGA around the ball of the BGA, the first plurality of staggered microvias are staggered with respect to the plurality of peripheral buried-vias; and
a second plurality of staggered microvias to ground the plurality of the peripheral buried-vias, the second plurality of staggered microvias are staggered with respect to the plurality of peripheral buried-vias.

20. A vehicle comprising:
a system controller configured to control one or more vehicular systems of the vehicle based on radar information; and
a radar device configured to provide the radar information to the system controller, the radar device comprising:
a radar processor configured to provide the radar information based on radar signals;
a Surface Mounted Device (SMD) to process communication of the radar signals;
a Printed Circuit Board (PCB);
a Ball Grid Array (BGA) on a first side of the PCB, the BGA configured to connect the SMD to the PCB;
a plurality of Transmit (Tx) antennas disposed on a second side of the PCB opposite to the first side;
a plurality of Receive (Rx) antennas disposed on the second side of the PCB;
a first plurality of Radio Frequency (RF) transitions to transit a plurality of Tx signals from the BGA to the plurality of Tx antennas; and
a second plurality of RF transitions to transit a plurality of Rx signals from the plurality of Rx antennas to the BGA,
wherein an RF transition of the first plurality of RF transitions or the second plurality of RF transitions is configured to transit an RF signal between the BGA and an antenna of the plurality of Tx antennas or the plurality of Rx antennas, the RF transition comprising:
a plurality of signal buried-vias;
a first plurality of microvias connected by a first buried-via connection layer to first ends of the plurality of signal buried-vias, the first plurality of microvias connected by a first microvia connection layer to a ball of the BGA, the first plurality of microvias to transit the RF signal between the plurality of signal buried-vias and the ball of the BGA, the first plurality of microvias are rotationally misaligned with respect to the plurality of signal buried-vias; and
a second plurality of microvias connected by a second buried-via connection layer to second ends of the plurality of signal buried-vias, the second plurality of microvias connected by a second microvia connection layer to the antenna, the second plurality of microvias to transit the RF signal between the plurality of signal buried-vias and the antenna, the second plurality of microvias are rotationally misaligned with respect to the plurality of signal buried-vias.

21. The vehicle of claim 20, wherein the plurality of buried-vias comprises at least three buried-vias, the first plurality of microvias comprises at least three microvias, and the second plurality of microvias comprises at least three micovias.

22. The vehicle of claim 20, wherein the plurality of signal buried-vias are arranged in a first ring, the first plurality of microvias are arranged in a second ring concentric with the first ring, and the second plurality of microvias are arranged in a third ring concentric with the first ring.

* * * * *

UNITED STATES PATENT AND TRADEMARK OFFICE
CERTIFICATE OF CORRECTION

| | |
|---|---|
| PATENT NO. | : 11,596,055 B2 |
| APPLICATION NO. | : 16/727980 |
| DATED | : February 28, 2023 |
| INVENTOR(S) | : Ofer Markish et al. |

It is certified that error appears in the above-identified patent and that said Letters Patent is hereby corrected as shown below:

In the Claims

In Column 25, Line 51, in Claim 1, delete "a plurality of Receive (Rx) antennas disposed on a second" and insert -- a plurality of Receive (Rx) antennas disposed on the second --, therefor Signed and Sealed this
Twenty-fifth Day of April, 2023

Katherine Kelly Vidal
*Director of the United States Patent and Trademark Office*